United States Patent
Choo et al.

(10) Patent No.: US 11,073,944 B2
(45) Date of Patent: Jul. 27, 2021

(54) COOKING APPARATUS AND CONTROLLING METHOD THEREOF

(71) Applicant: SAMSUNG ELECTRONICS CO., LTD., Suwon-si (KR)

(72) Inventors: Hyunjoon Choo, Suwon-si (KR); Changsun Yun, Suwon-si (KR); Dongoh Kang, Suwon-si (KR); Youngwoong Joo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/844,545

(22) Filed: Apr. 9, 2020

(65) Prior Publication Data
US 2020/0326812 A1     Oct. 15, 2020

(30) Foreign Application Priority Data

Apr. 15, 2019 (KR) .................. 10-2019-0043974

(51) Int. Cl.
*G06F 3/041* (2006.01)
*F24C 7/08* (2006.01)

(52) U.S. Cl.
CPC ............ *G06F 3/0418* (2013.01); *F24C 7/086* (2013.01); *G06F 3/0412* (2013.01); *G06F 2203/04105* (2013.01)

(58) Field of Classification Search
CPC .... G06F 3/0418–04182; G06F 3/0414–04146; G06F 3/044–0448; G06F 2203/04104; G06F 2203/04105; G06F 3/01–04897; G06F 2203/01–04809
See application file for complete search history.

(56) References Cited

U.S. PATENT DOCUMENTS

| 5,345,807 A * | 9/1994 | Butts ...................... F24C 7/06 73/1.15 |
| 9,377,898 B2 * | 6/2016 | Shin ...................... G06F 3/0446 |
| 9,529,475 B2 | 12/2016 | Zhou et al. |
| 2009/0267898 A1 * | 10/2009 | Yamamoto ............ G06F 3/0346 345/158 |
| 2014/0078115 A1 | 3/2014 | Itsuki |

(Continued)

FOREIGN PATENT DOCUMENTS

| EP | 0535907 | 4/1993 |
| JP | 2012-17882 | 1/2012 |

(Continued)

OTHER PUBLICATIONS

Extended European Search Report dated Aug. 14, 2020 in European Patent Application No. 20166649.2.

(Continued)

*Primary Examiner* — Sanjiv D. Patel
(74) *Attorney, Agent, or Firm* — Staas & Halsey LLP

(57) ABSTRACT

A cooking apparatus is provided. The cooking apparatus includes an input panel comprising a plurality of touch buttons, and a processor configured to enter a calibration mode according to a predetermined event, receive a signal corresponding to a test input for a first touch button among the plurality of touch buttons from the input panel in the calibration mode, and adjust a threshold value for identifying whether the first touch button was touched based on the strength of the received signal.

15 Claims, 17 Drawing Sheets

(56) References Cited

U.S. PATENT DOCUMENTS

2018/0046319 A1* 2/2018 Luo ................. G06F 3/0418
2018/0059866 A1* 3/2018 Drake ............... G06F 3/0447
2019/0155431 A1* 5/2019 Lee .................. H03M 1/12

FOREIGN PATENT DOCUMENTS

| | | |
|---|---|---|
| JP | 5220886 | 6/2013 |
| KR | 10-2015-0020774 | 2/2015 |
| KR | 10-1578138 | 12/2015 |
| WO | 02/35460 | 5/2002 |
| WO | 2009/000289 | 12/2008 |

OTHER PUBLICATIONS

European Communication dated May 3, 2021 in European Patent Application No. 20166649.2.

* cited by examiner

COOKING APPARATUS AND CONTROLLING METHOD THEREOF

CROSS-REFERENCE TO RELATED APPLICATION(S)

This application is based on and claims priority under 35 U.S.C. § 119(a) of a Korean patent application number 10-2019-0043974, filed on Apr. 15, 2019, in the Korean Intellectual Property Office, the disclosure of which is incorporated by reference herein in its entirety.

BACKGROUND

1. Field

The disclosure relates to a cooking apparatus and a controlling method thereof, and more particularly, to a cooking apparatus that adjusts the touch sensitivity of a touch button included in the cooking apparatus, and a controlling method thereof.

2. Description of Related Art

A touch button included in a cooking apparatus may perform a corresponding operation based on a touch input. Here, a cooking apparatus may digitize a value for a touch input of a user and identify whether the value exceeded a reference value or a threshold value, and in case the value exceeded a reference value or a threshold value, the cooking apparatus may determine that there was a touch input of a user.

However, a problem may occur in input to a touch button in an assembly process or a use process of a cooking apparatus. For example, a problem that, even though a touch button was touched with the same strength, the button does not react may occur. In this case, the reason for the malfunction as to the touch button may be found by disassembling the entire cooking apparatus for repair, or the touch button itself may be replaced.

However, there is a problem that a process of replacing or repairing specific hardware of a cooking apparatus may be rather inconvenient, and a cost for replacement may be incurred. Also, there is inconvenience that a person who repairs has to determine both of the configuration and the assembling method of an individual cooking apparatus for disassembling a cooking apparatus and reassembling it. In addition, a problem that, in a process of disassembling a cooking apparatus because of the problem of a specific touch button, breakage is generated in another hardware part may occur.

SUMMARY

A cooking apparatus according to an embodiment of the disclosure for achieving the aforementioned purpose includes an input panel including a plurality of touch buttons, and a processor configured to enter a calibration mode according to a predetermined event, receive a signal corresponding to a test input for a first touch button among the plurality of touch buttons from the input panel in the calibration mode, and adjust a threshold value for identifying whether the first touch button was touched based on the strength of the received signal.

Meanwhile, in a controlling method of a cooking apparatus including an input panel comprising a plurality of touch buttons according to an embodiment of the disclosure, the method includes the steps of entering a calibration mode according to a predetermined event, receiving a signal corresponding to a test input for a first touch button among the plurality of touch buttons from the input panel in the calibration mode, and adjusting a threshold value for identifying whether the first touch button was touched based on the strength of the received signal.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
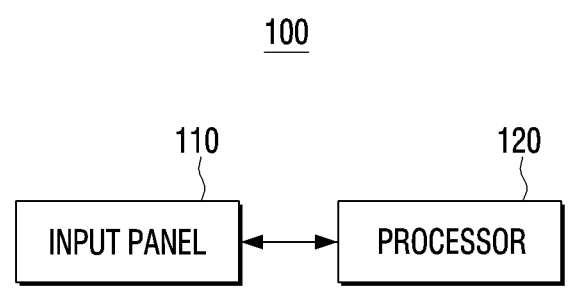
FIG. 1 is a block diagram illustrating a cooking apparatus according to an embodiment.

The disclosure was devised for improving the aforementioned problems, and the purpose of the disclosure is in providing a cooking apparatus which adjusts a threshold value of a touch button included in the cooking apparatus based on a touch input received in a calibration mode, and a controlling method thereof.

Hereinafter, the disclosure will be described in detail with reference to the accompanying drawings.

As terms used in the embodiments of the disclosure, general terms that are currently used widely were selected as far as possible, in consideration of the functions described in the disclosure. However, the terms may vary depending on the intention of those skilled in the art who work in the pertinent field, previous court decisions, or emergence of new technologies. Also, in particular cases, there may be terms that were designated by the applicant on his own, and in such cases, the meaning of the terms will be described in detail in the relevant descriptions in the disclosure. Thus, the terms used in the disclosure should be defined based on the meaning of the terms and the overall content of the disclosure, but not just based on the names of the terms.

In this specification, expressions such as "have," "may have," "include" and "may include" should be construed as denoting that there are such characteristics (e.g.: elements such as numerical values, functions, operations and components), and the expressions are not intended to exclude the existence of additional characteristics.

Also, in the disclosure, the expression "at least one of A and/or B" should be understood to denote any one of "A" or "B" or "A and B."

In addition, the expressions "first," "second" and the like used in this specification may be used to describe various elements regardless of any order and/or degree of importance. Also, such expressions are used only to distinguish one element from another element, and are not intended to limit the elements.

The description in the disclosure that one element (e.g.: a first element) is "(operatively or communicatively) coupled with/to" or "connected to" another element (e.g.: a second element) should be interpreted to include both the case where the one element is directly coupled to the another element, and the case where the one element is coupled to the another element through still another element (e.g.: a third element).

Singular expressions also include plural expressions, as long as they do not obviously mean differently in the context. In addition, in this specification, terms such as "include" and "consist of" should be construed as designating that there are such characteristics, numbers, steps, operations, elements, components or a combination thereof described in the specification, but not to exclude in advance the existence or possibility of adding one or more of other characteristics, numbers, steps, operations, elements, components or a combination thereof.

In the disclosure, the terms "a module" or "a part" perform at least one function or operation, and these elements may be implemented as hardware or software, or as a combination of hardware and software. Further, a plurality of "modules" or "parts" may be integrated into at least one module and implemented as at least one processor (not shown), except "modules" or "parts" that need to be implemented as specific hardware.

Meanwhile, in this specification, the term "user" may refer to a person who uses an electronic apparatus (a cooking apparatus) or an apparatus using an electronic apparatus (e.g.: an artificial intelligence electronic apparatus).

Hereinafter, an embodiment of the disclosure will be described in more detail with reference to the accompanying drawings.

FIG. 1 is a block diagram illustrating a cooking apparatus according to an embodiment of the disclosure.

Referring to FIG. 1, the cooking apparatus 100 may comprise an input panel 110 and a processor 120.

The cooking apparatus 100 is a home appliance cooking a cooking substance, and it may be a gas oven combusting gas and heating a cooking substance, an electronic oven converting electronic energy into heat energy and heating a cooking substance, a microwave oven irradiating microwaves on a cooking substance and heating the cooking substance, a gas range combusting gas and heating a container containing a cooking substance, an apparatus generating magnetic waves and heating a container containing a cooking substance, an induction apparatus, a highlight apparatus, etc.

The input panel 110 may receive various kinds of inputs related to control of the cooking apparatus 100. Specifically, the input panel 110 may include a touch area receiving inputs of functional instructions related to control of a heating part 140. Here, a functional instruction may be a turning-on/turning-off instruction, a strength adjusting instruction, a timer setting instruction, etc. of the cooking apparatus 100.

Meanwhile, the input panel 110 may be located in an area of the upper plate panel of the cooking apparatus 100. Here, the upper plate panel may be implemented as glass arranged on the upper side of an induction including the heating part 140 in case the cooking apparatus 100 is implemented as an induction, for example. The input panel 110 may receive various kinds of user inputs and transmit them to the processor 120. In particular, the input panel 110 may include at least one of a touch sensor, a (digital) pen sensor, a pressure sensor, a keyboard, or a key. Also, the input panel 110 is a component receiving a user input, and may be distinguished from the heating part 140 area. That is, the heating part 140 may be arranged in some areas of the upper plate panel of the cooking apparatus 100, and the input panel 110 may be arranged in some other areas of the upper plate panel. Meanwhile, according to another embodiment of the disclosure, the input panel 110 and the heating part 140 may be arranged in the upper end part or the lower end part of the upper plate panel.

In the disclosure, the input panel 110 may include a touch sensor detecting a touch input of a user. The touch sensor may be implemented as a capacitive type. A capacitive type may be a type of using a dielectric substance coated on the surface of an input panel, and when a part of a user's body touches the surface of the input panel, detecting micro electricity excited to the user's body and calculating a touch coordinate.

Also, the input panel 110 may comprise a plurality of touch sensors. For example, the input panel 110 may comprise a first touch sensor having a predetermined form and a second touch sensor arranged around the aforementioned first touch sensor. Here, a predetermined form may be a circular form, but is not limited thereto. Also, the second touch sensor may be constituted to be integrated with the first touch sensor, and according to another embodiment of the disclosure, the second touch sensor and the first touch sensor may be constituted as separate sensors.

The input panel 110 may receive an input of a functional instruction related to control of the heating part 140 from a user, and transmit an electronic signal corresponding to the functional instruction input from the user to the processor 120.

The processor 120 may control the overall control operations of the cooking apparatus. Specifically, the processor 120 performs the function of controlling the overall operations of the cooking apparatus.

The processor 120 may be implemented as a digital signal processor (DSP) processing digital image signals, a microprocessor, and a time controller (TCON). However, the disclosure is not limited thereto, and the processor 120 may include one or more of a central processing unit (CPU), a micro controller unit (MCU), a micro processing unit (MPU), a controller, an application processor (AP) or a communication processor (CP), and an ARM processor, or may be defined by the terms. Also, the processor 120 may be implemented as a system on chip (SoC) having a processing algorithm stored therein or large scale integration (LSI), or in the form of a field programmable gate array (FPGA). In addition, the processor 120 may perform various functions by executing computer executable instructions stored in the memory.

The processor 120 may process setting values, functional instructions, etc. according to a control program or control data memorized in the memory 130, and output a control signal controlling the heating part 140 or a communication signal for communicating with an external cooking apparatus.

For example, if a functional instruction is received from the input panel 110, the processor 120 may control the components of the cooking apparatus 100 such that the cooking apparatus 100 is turned on or turned off according to the received functional instruction. Also, the processor 120 may control the heating part 140 such that the heating part 140 operates or the operation of the heating part 140 is stopped according to the input functional instruction.

The processor 120 may perform control such that an input of a user (or a touch input of a user) is received through the input panel 110 including a plurality of touch buttons. The cooking apparatus 100 may be implemented as a form of including a plurality of touch buttons in the input panel 110. Explanation regarding the plurality of touch buttons will be made later with reference to FIG. 3.

The processor 120 may perform control such that a calibration mode is entered according to a predetermined event. Here, a predetermined event may include at least one of an event wherein at least some buttons among the plurality of touch buttons are sequentially push-manipulated or an event wherein the at least some buttons are simultaneously push-manipulated (or an event wherein the at least some buttons are pushed at the same time). A button operation as above is for making the manufacturer test a function or a function key, etc. provided on the cooking apparatus 100, or enter a mode for repair, and it may be referred to as, for example, a hidden key manipulation. As an example, a hidden key manipulation may be a manipulation of pushing a first button and a second button among the plurality of buttons included in the input panel 110 of the cooking apparatus 100 sequentially within a predetermined time period. When the processor 120 identifies that a hidden key was input, a calibration mode may be entered. Here, the calibration mode may mean a mode wherein the setting related to the cooking apparatus 100 is changed. Meanwhile, the calibration mode may be replaced with words such as an administrator mode and a setting mode. Also, the processor 120 may perform a touch sensitivity inspection for at least one button included in the cooking apparatus 100 in the calibration mode. Here, a touch sensitivity inspection may be an inspection of measuring touch sensitivity of a touch button. In the disclosure, touch sensitivity means the degree of a user's feeling about whether a touch input for a specific button is performed normally. For example, the feature that touch sensitivity is good may mean that a touch input is performed normally even with a touch of weak strength, and the feature that touch sensitivity is bad may mean that a touch input is not performed normally even with a touch of powerful strength. In this specification, a touch sensitivity inspection may be abbreviated as an inspection.

The processor 120 may receive a signal corresponding to a test input for the first touch button among the plurality of touch buttons from the input panel 110 in the calibration mode. Meanwhile, a signal corresponding to a test input may mean a touch input signal received from the input panel 110. Specifically, a signal corresponding to a test input may be any one of a capacitance corresponding to a touch input, an amount of change of a capacitance, the charging time of a capacitance (or the charging and discharging cycle of a capacitance), an amount of change of a voltage applied to a touch sensor, or an amount of change of a current. Meanwhile, a signal corresponding to a test input may be a value sensed at a touch sensor itself, or a signal wherein a sensed value was converted. For example, if it is assumed that a value sensed at a touch sensor is an amount of change of a capacitance, the processor 120 may receive the amount of change of the capacitance as it is, or receive a signal wherein the amount of change of the capacitance was converted at the touch sensor. Depending on cases, when a signal corresponding to a test input is received, the processor 120 may convert the received signal.

Here, a test input may be a touch input using a touch rod (or a separate touch test apparatus or an exclusive pen or a sensitivity rod) providing consistent touch strength. Meanwhile, in the case of using a touch rod (a touch test apparatus), the processor 120 may receive a constant signal value. For example, in case a user performs a test for a specific touch button through a touch rod, the cooking apparatus 100 may receive a test input having constant signal strength. Here, a test input may be received only once, but according to another embodiment of the disclosure, test inputs may be received several times at regular time intervals. Here, the strength of a measured signal may differ according to the diameter of the touch rod. For example, as the diameter of the touch rod becomes bigger, the strength of a signal may become bigger, and the feature that the strength of a signal becomes bigger may mean that the amount of change of the capacitance or the charging time of the capacitance becomes bigger. Meanwhile, if a touch rod (a touch test apparatus) is used, constant signal strength may be acquired compared to a case wherein a part of a human body is touched.

Meanwhile, depending on cases, a test input may be a touch input by a part of a user's body (e.g., a user's hand). Here, a signal corresponding to a test input may be a signal value corresponding to a touch input, e.g., a signal value corresponding to the pressure or the strength of a touch.

Then, the processor 120 may compare the acquired signal value of the user input and the threshold value of the first button. Meanwhile, for comparing the signal value of the received input and the threshold value of the first button, the processor 120 may convert the signal value by a predetermined method. For example, the processor 120 may scale the received signal value to a signal value for comparing with the threshold value of the first button.

Meanwhile, the processor 120 may compare the signal value of the received user input for the first button and the threshold value of the first button, and determine touch sensitivity for the first button. In case the signal value of the user input for the first button is greater than or equal to the threshold value of the first button, the processor 120 may identify that a touch for the first button is performed normally. However, in case the signal value of the user input for the first button is smaller than the threshold value of the first button, the processor 120 may identify that a touch for the first button is not performed normally.

An operation of comparing the signal value of a user input for the first button and the threshold value of the first button will be described in detail later with reference to FIGS. 7 and 8.

Meanwhile, if it is identified that the first button does not operate normally, the processor 120 may adjust (or change) the threshold value of the first button. Specifically, if the processor 120 identifies that the strength of a received signal (the signal value of a received input) is smaller than a threshold value for identifying whether the first touch button was touched, the processor 120 may adjust the threshold value of the first button. Then, the processor 120 may perform a touch sensitivity inspection for the first button again based on the adjusted threshold value. That is, the processor 120 may identify whether the first button is touched normally based on the adjusted threshold value. For performing an inspection again, the processor 120 may use a new user input according to an embodiment of the disclosure. The processor 120 may perform an inspection by comparing the adjusted threshold value and the signal value of a new user input for the first button. For example, the processor 120 may identify whether the strength of a signal received from the input panel 110 after the threshold value was adjusted is greater than or equal to the adjusted threshold value, and if the strength of the signal received after the threshold value was adjusted is greater than or equal to the adjusted threshold value, the processor 120 may finish calibration for the first touch button. Here, the signal value of a user input for the first button may be a value received after the threshold value was adjusted. The signal value of a user input for the first button received before the threshold value was adjusted and the signal value of a user input for the first button received after the threshold value was adjusted may be the same or different according to the strength of the user input. Meanwhile, in the case of receiving constant user inputs such as touching the first button with a touch rod, a signal value received before the threshold value was adjusted and a signal value received after the threshold value was adjusted may be almost similar.

Meanwhile, according to another embodiment of the disclosure, the processor 120 may perform an inspection by comparing the adjusted threshold value and the signal value of the previous user input for the first button. The processor 120 may not receive a new user input after the threshold value was changed, and perform an inspection based on the signal value of the user input for the first button previously received and the adjusted threshold value.

Meanwhile, if it is identified that the first button is touched normally, the processor 120 may finalize the threshold value of the first button and store the value in the memory, and finish the inspection (calibration) for the first button. Here, it was described that the cooking apparatus 100 includes the first button, but in actual implementation, the cooking apparatus 100 may include a plurality of buttons. It will be assumed that the cooking apparatus 100 includes the first button and the second button. The cooking apparatus 100 may include more buttons in actual implementation. The processor 120 may perform a touch sensitivity inspection for all of the plurality of buttons. Specifically, when the inspection for the first button is completed, the processor 120 may perform an inspection for the second button, and the order by which the plurality of buttons are inspected may be, for example, the order of the identification number of each button. Also, as another example, regarding the order by which the plurality of buttons are inspected, a user may directly select the order.

Meanwhile, after calibration for the first touch button is finished, the processor 120 may receive a signal corresponding to a test input for the second touch button from the input panel 110. Here, when a user input for the second touch button (the second button) is received, the processor 120 may acquire a corresponding signal value. Then, the processor 120 may perform an inspection for the second button by comparing the signal value of the acquired user input for the second button and the threshold value of the second button.

Here, if the strength of the signal received for the second touch button (the signal value of the user input for the second button) is smaller than the threshold value for identifying whether the second touch button was touched, the processor 120 may determine that the second button is abnormal (or in a broken state). Then, the processor 120 may adjust the threshold value for identifying whether the second touch button was touched so that the second touch button can be touched normally.

Meanwhile, it will be described how the threshold value will be operated in the aforementioned adjusting operation of the threshold value. While the operation will be described as adjustment of the threshold value for the first button, the operation can be applied to all buttons included in the cooking apparatus 100.

In case it is identified that the first button is not normal in the inspection (calibration) for the first button, the processor 120 may reduce the threshold value of the first button. When the threshold value is reduced, the standard will be changed to be lower, and thus signal values in a wider range may be recognized as a normal range. For example, it will be assumed that the threshold value of the first button is 50, and the threshold value adjusted by the processor 120 is 30. In case the threshold value of the first button is 50, the processor 120 may determine that there was a normal touch for the first button only when the signal value of a user input for the first button is greater than or equal to 50. However, in case the threshold value of the first button is 30, if the signal value of a user input for the first button is greater than or equal to 30, the processor 120 may determine that there was a normal touch for the first button. Accordingly, as the threshold value of the first button is lower, the range of signal values for which touch inputs for the first button are determined as normal may become wider. If the threshold value for the first button becomes lower, the touch sensitivity of the first button may become sensitive.

Even if a user touches the first button and the second button with the same strength, the sizes of signal values of each button may differ due to a structural problem or breakage of the touch sensor. In case a user pushes a specific button with the same strength, it may be recognized that the touch was not performed normally for the button wherein a problem occurred. In this case, the processor 120 may solve the problem by changing the threshold value of the button wherein a problem occurred.

Meanwhile, if the strength of a received signal is smaller than the threshold value for identifying whether the first touch button was touched, the processor 120 may reduce the threshold value. Then, the processor 120 may newly acquire the signal value of a user input for the first button from the input panel 110 after the threshold value of the first button was reduced. Also, the processor 120 may identify whether the newly acquired strength of the signal (the signal value) of the user input for the first button is greater than or equal to the reduced threshold value. If the strength of the received signal is smaller than the reduced threshold value, the processor 120 may determine that touch sensitivity is not good even by the reduced threshold value. That is, the processor 120 may determine that a touch for the first button is not performed normally. Accordingly, the processor 120 may additionally reduce the reduced threshold value.

Meanwhile, the processor 120 may adjust the threshold value by changing the threshold value of the first button by a predetermined ratio. The feature of changing the threshold value by a predetermined ratio may mean multiplying a number between 0 and 1 with the previous threshold value. For example, an operation of reducing the threshold value as much as 70% may mean an operation of changing the previous threshold value 100 to 70.

If the strength of a received signal is smaller than the threshold value for identifying whether the first touch button was touched, the processor 120 may identify that a touch for the first button is not performed normally, and adjust the threshold value. Here, the processor 120 may reduce the threshold value by a predetermined ratio, and acquire the signal value of a new user input for the first button from the input panel 110 after the threshold value was reduced. Then, the processor 120 may perform a touch sensitivity inspection again by identifying whether the acquired signal value is greater than or equal to the reduced threshold value. If the newly acquired signal value of a user input for the first button is smaller than the reduced threshold value in the touch sensitivity inspection performed again, the processor 120 may additionally reduce the reduced threshold value by a predetermined ratio. For example, it will be assumed that the initial threshold value of the first button is 100 and the predetermined ratio is 70%. The processor 120 may adjust the threshold value of the first button to 70 in the first adjustment, and then adjust the threshold value of the first button to 49 again through the second adjustment.

Meanwhile, if the signal value of a user input for the first button is smaller than the threshold value for identifying whether the first touch button was touched, the processor 120 may set a value smaller than the signal value of the received user input for the first button as the threshold value. For example, it will be assumed that the signal value of a user input for the first button is 30, and the threshold value of the first button is 50. In this case, the processor 120 may change the threshold value of the first button to a value smaller than 30 which is the signal value of the user input for the first button. If the threshold value of the first button is changed to a value smaller than the signal value of the user input for the first button, a problem may be solved by changing the threshold value only once without changing the threshold value a plurality of times. Accordingly, there may be an effect that the processing speed for problem solving becomes faster.

Also, the processor 120 may receive a signal corresponding to a touch input for the first touch button from the input panel 110 in the normal mode, and if the strength of a signal received in the normal mode is greater than or equal to the threshold value, the processor 120 may perform an operation corresponding to the first touch button. Meanwhile, if the strength of a received signal is smaller than the threshold value, the processor 120 may not perform an operation corresponding to the first touch button.

The normal mode may mean a mode wherein the functions of the cooking apparatus 100 are used, and also, it may mean a mode wherein an operation of heating a specific area of the cooking apparatus 100, an operation of adjusting the temperature of heat such that a specific area of the cooking apparatus 100 is heated to a specific temperature, etc. can be performed. A cooking function cannot be performed in the calibration mode, unlike in the normal mode, but the detailed setting of the cooking apparatus 100 may be adjusted. Here, the calibration mode may include an operation of performing a touch sensitivity inspection of a specific button and changing the threshold value of the specific button.

If a touch input of a user is received for the first button in the calibration mode, the processor 120 may perform a touch sensitivity inspection, and determine whether to adjust the threshold value of the first button.

However, if a touch input of a user is received for the first button in the normal mode, it may be determined whether a touch has been performed. Here, in case it is determined that the first button was touched by the touch input of the user, the processor 120 may perform an operation corresponding to the first button. Here, an operation of determining that the first button was touched may be an operation of determining whether the signal value of the user input for the first button is greater than or equal to the threshold value of the first button. For example, if a touch of the first button is recognized, the processor 120 may perform an operation of adding heat to the first area.

Meanwhile, in case there is a predetermined event, the processor 120 may immediately finish (or terminate or end) the calibration mode. In case the amount of change of the strength of a signal received from the input panel 110 after the calibration mode was entered falls within a threshold range during a predetermined time period, the processor 120 may finish the calibration mode. An operation of immediately finishing the calibration mode will be described in detail later with reference to FIG. 13.

Also, if a plurality of touch inputs for the first touch button are sequentially received, the processor 120 may receive signals corresponding to the plurality of received touch inputs from the input panel 110, and adjust the threshold value based on at least one of the maximum value, the minimum value among the plurality of received signals or the average value of the plurality of signals.

An embodiment wherein a plurality of touch inputs are received will be described in detail later with reference to FIGS. 14 to 16.

Meanwhile, the cooking apparatus 100 may further include a display, and the processor 120 may control the display to display the threshold value and the strength of a received signal. An operation of displaying the signal value of a user input for the first button and the threshold value of the first button through the display will be described in detail later with reference to FIG. 6.

In case the cooking apparatus 100 includes a plurality of buttons, a touch sensitivity inspection may also be performed with respect to the plurality of buttons. Here, a user may be confused about for which button a touch sensitivity inspection is performed. Even if a touch sensitivity inspection is performed by a predetermined order, locations of buttons are different for each model of cooking apparatuses.

Accordingly, a user may be confused about for which button a touch sensitivity inspection is being performed.

For resolving the aforementioned problem, the cooking apparatus 100 may further include light emitting diodes corresponding to each of the plurality of buttons. That is, a plurality of touch buttons may be arranged together with light emitting diodes. Here, in case a touch sensitivity inspection is performed for the first button in the calibration mode, the processor 120 may turn on the first light emitting diode corresponding to the first touch button. Then, when the touch sensitivity inspection for the first touch button is finished and a touch sensitivity inspection for the second touch button begins, the processor 120 may turn off the first light emitting diode and turn on the second light emitting diode corresponding to the second touch button. In case a touch sensitivity inspection is performed, if a light emitting diode corresponding to a specific button for which the touch sensitivity inspection is performed is turned on, the user can easily figure out for which button the touch sensitivity inspection is performed.

Meanwhile, in this specification, an operation of changing a threshold value to be smaller for adjusting the threshold value was mainly described, but an operation of changing a threshold value to be smaller may be a solving method limited to embodiments wherein a touch button is not pushed. In contrast, if a problem that a specific button reacts too easily occurs, the problem may be resolved through an operation of raising the threshold value. In this specification, a case wherein a touch is not performed well is described, but all operations described in this specification can be modified and applied to a problem that a touch for a specific button is performed too well.

As an example, in case the signal value of a user input for the first button is bigger than the threshold value of the first button by greater than or equal to a predetermined size, the processor 120 may raise the threshold value of the first button to an appropriate value. For example, it will be assumed that the signal value of a user input for the first button is 100, and the threshold value of the first button is 50. Also, it will be assumed that the predetermined size is 20. The processor 120 may identify that the signal value 100 of a user input for the first button is bigger than the threshold value 50 of the first button as much as 50. Then, the processor 120 may determine that touch sensitivity for the first button is too sensitive, and determine that, in this case, the user may feel inconvenience. Accordingly, the processor 120 may adjust the threshold value such that the threshold value of the first button is raised and appropriate touch sensitivity is maintained.

Meanwhile, in the above, only simple components constituting the cooking apparatus 100 have been illustrated and described, but in actual implementation, various components may be additionally provided. Explanation in this regard will be made below with reference to FIG. 2.

The cooking apparatus 100 according to an embodiment of the disclosure may perform a touch sensitivity inspection by adjusting only the threshold value of a specific button. In particular, by easily figuring out a touch sensitivity problem that can be solved in terms of software, inconvenience that a consumer feels can be solved fast and conveniently without disassembling the cooking apparatus 100. Also, there is an advantage that, depending on cases, a consumer can directly solve a touch sensitivity problem.

Figure 2:
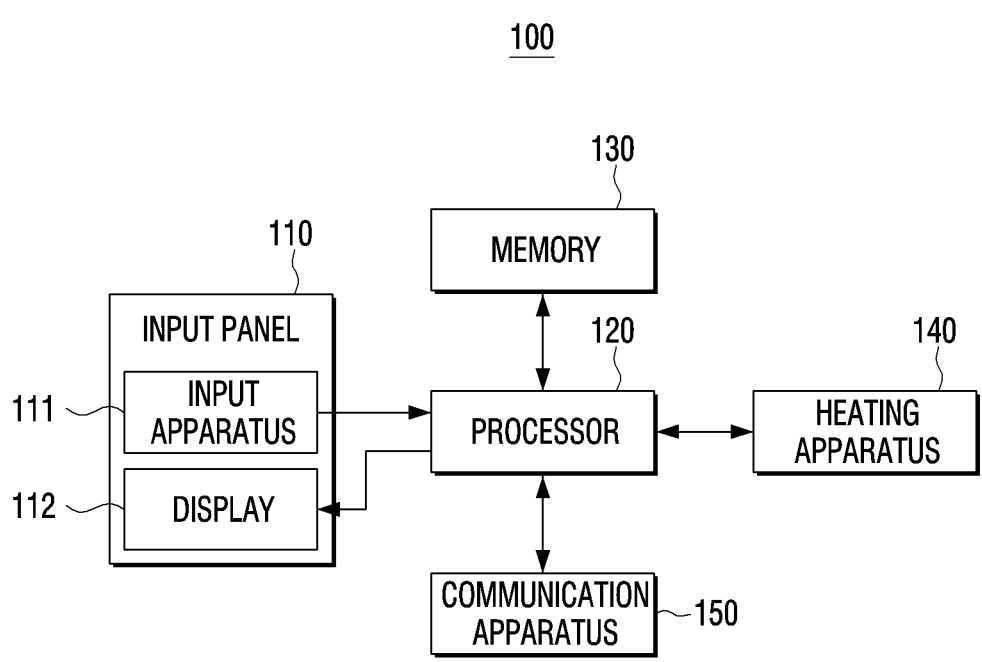
FIG. 2 is a block diagram for illustrating a detailed configuration of the cooking apparatus in FIG. 1 according to an embodiment.

FIG. 2 is a block diagram for illustrating a detailed configuration of the cooking apparatus 100 in FIG. 1.

Referring to FIG. 2, the cooking apparatus 100 may comprise an input panel 110, a processor 120, a memory 130, a heating part 140, and a communication apparatus 150.

Among the operations of the input panel 110 and the processor 120, regarding the operations that are the same as the operations explained earlier, overlapping explanation will be omitted.

The input panel 110 may comprise an input apparatus 111 and a display 112.

The input panel 110 may include an input apparatus 111 comprising of a plurality of buttons or a keypad, etc. enabling a user to set various kinds of functions of the cooking apparatus 100 and a user interface including a display 112 displaying various kinds of information related to the cooking apparatus 100.

Here, the input apparatus 111 may mean various types of buttons such as a mechanical button, a touch pad, a wheel, etc. formed in any areas like the front surface part or the side surface part of the exterior of the cooking apparatus 100. Meanwhile, in FIG. 2, the input apparatus 111 and the display 112 were described as separate components, but in actual implementation, the cooking apparatus 100 may be implemented as a form wherein the input apparatus 111 and the display are one panel like a touch screen panel.

In case a touch sensor provided on the input panel 110 is implemented as a capacitive type, the touch sensor may transmit a signal related to the capacitance generated by a user's touch to the processor 120, and the processor 120 may identify whether there was a user's touch based on the received signal. A capacitance may mean a capacity of storing electric charges by an electric field between two conductors or electrodes. Between two objects wherein electricity flows, a space which is an electric field is generated, and electricity may be stored in this space. That is, a capacitance may mean the amount of electricity that can be stored in an electric field.

In a capacitive type, if a voltage (or a current) is applied to a specific electrode among a plurality of electrodes, counter electric charges may be charged in an electrode different from the electrode that applied a voltage (or a current) by an electric field generated between electrodes. For example, if a human finger touches a touch screen panel, a change may occur in an electric field existing between two electrodes. The aforementioned change may influence electric charges charged in an electrode. Accordingly, the cooking apparatus 100 may identify whether a user touched a specific button through the change of the amount of electric charges.

As an example, the touch sensor included in the input panel 110 may measure a capacitance at regular time intervals. Then, the touch sensor may transmit a result value regarding the measured capacitance (a signal related to the capacitance) to the processor 120. In this case, if the currently received capacitance exceeds the first threshold value, the processor 120 may determine that the user touched (or clicked) a specific button. Meanwhile, in case a difference value between the previously received capacitance and the currently received capacitance exceeds the second threshold value, the processor 120 may determine that the user touched (or clicked) a specific button.

As another example, the processor 120 may measure the charging time of the capacitance included in the touch sensor at regular time intervals. In case there is no touch input of a user, the touch sensor may have a constant capacitance and may perform charging by applying a voltage (or a current). Then, when the capacitance is fully charged, the processor 120 may measure the charging time from the starting point of charging to the completion point of charging. Also, when charging is completed, the processor 120 may discharge the capacitance, and acquire the charging time of the capacitance while repeating charging and discharging at regular time intervals again.

Here, in case there is no touch input of a user, the charging time repeatedly acquired at the processor 120 may be constant. However, in case there is a touch input of a user, the capacity of the measured capacitance changes, and thus the charging time repeatedly acquired at the processor 120 may change. For example, if the capacity of the measured capacitance increases, the acquired charging time may become bigger. That is, if the charging time becomes bigger, the processor 120 may identify that the capacity of the capacitance increased.

In case there is a touch input of a user, the processor 120 may acquire an increased charging time based on the change of the capacity of the capacitance. In this case, if the acquired charging time is greater than or equal to a predetermined threshold value, the processor 120 may identify that there is a touch input of a user for a button. Meanwhile, in case the increased charging time is smaller than a predetermined threshold value, the processor 120 may identify that there is no touch input of a user for a button.

Meanwhile, in case a touch input of a user is a touch rod (a touch test apparatus), the capacitance measured may change according to the diameter of the touch rod. In general, as the diameter of the touch rod becomes bigger, the capacitance may increase, and if the capacitance increases, the charging time may increase. For example, according to an embodiment of the disclosure, a touch rod that can provide the same input as an average touch input of a user, i.e., a touch input of general strength that can manipulate a button may be used in a calibration mode.

Meanwhile, according to another embodiment of the disclosure, it may be determined whether a user touched a specific button at the touch sensor provided on the cooking apparatus 100 and the result regarding whether there was a touch may be transmitted to the processor 120. In this case, the processor 120 may identify whether to perform a corresponding function based on the received result.

According to an embodiment of the disclosure, the touch sensor may include a touch pad (a touch detector).

A touch pad may detect user inputs such as a touch, a drag, a drop, etc. from changes of the physical quantity, e.g., a resistance, a capacitance, etc. A touch pad comprises of a few layers such as a layer that a finger or a pen directly contacts, a layer wherein electrode rods form grid shapes in a horizontal or vertical direction, a connected circuit board layer, etc. Here, a layer wherein there are electrode rods is charged by constant alternating currents, and when a finger or a touch rod (a test apparatus) approaches an electrode rod grid, the change of the current is detected by the circuit board.

According to another embodiment of the disclosure, the touch sensor may include a touch pad (a touch detector) and a signal converter (not shown). In this case, the signal converter (not shown) may convert the change of the physical quantity received from the touch pad (not shown) into a touch signal. For example, the signal converter (not shown) may convert the change of the physical quantity received from the touch pad (not shown) into a new digital signal by a predetermined method.

Meanwhile, a touch sensor according to still another embodiment of the disclosure may be implemented as a decompressive type. A decompressive type is a method wherein two electrode plates are included, and when a user touches a screen, it is detected that a current flows as the upper and lower plates of the touched point contact each other, and a touch coordinate is thereby calculated. In addition to the method, an infrared ray detection method, a surface ultrasonic wave conduction method, an integral tension measurement method, a piezo effect method, etc. may be used in detecting a touch manipulation. As described above, a touch sensor may be implemented in various forms.

Meanwhile, the input panel 110 may be replaced with words such as an inputter, an input receiver, a user interface, a button, and a touch screen panel. However, the input panel 110 is not limited to the aforementioned examples, and it may be replaced with various components performing an operation of receiving a touch input of a user.

Here, the display 112 may visually display the operation information of the cooking apparatus 100 to a user according to the control signal of the processor 120.

According to an embodiment of the disclosure, the display 112 may be implemented in the form of a touch screen combined with a touch sensor. For example, if the cooking apparatus 100 identifies that a user input was received in the area wherein the display 112 is arranged, the cooking apparatus 100 may perform an operation corresponding to the user input.

Meanwhile, according to another embodiment of the disclosure, the display 112 may not include a touch sensor. For example, the cooking apparatus 100 may be implemented as a form wherein the display 112 area and the touch sensor are physically distinguished.

Meanwhile, according to still another embodiment of the disclosure, the display 112 may be implemented as various forms of displays such as a liquid crystal display (LCD), an organic light emitting diodes (OLED) display, and a plasma display panel (PDP). Also, inside the display 112, driving circuits that may be implemented in forms such as an a-si TFT, a low temperature poly silicon (LTPS) TFT, an organic TFT (OTFT), etc., a backlight unit, etc. may also be included together.

Meanwhile, in FIG. 2, it was described that the display 112 is included in the input panel 110, but in actual implementation, the cooking apparatus 100 may be implemented as a form wherein the display 112 is arranged in a separate area which is not the input panel. Also, according to another embodiment of the disclosure, the display 112 may be implemented as a separate display apparatus.

The memory 130 may store a program or data for controlling the cooking apparatus 100.

The memory 130 may store a control program or control data for controlling the cooking apparatus 100, or memorize a user manipulation input or a functional instruction input through the input panel 110, a control signal output by the processor 120, etc.

For example, the memory 130 may be implemented as an internal memory such as a ROM (e.g., an electrically erasable programmable read-only memory (EEPROM)), a RAM, etc., included in the processor 120, or implemented as a separate memory from the processor 120. In this case, the memory 130 may be implemented in the form of a memory embedded in the cooking apparatus 100, or implemented in the form of a memory that can be attached to or detached from the cooking apparatus 100 according to the use of stored data. For example, in the case of data for driving the cooking apparatus 100, the data may be stored in a memory embedded in the cooking apparatus 100, and in the case of data for the extended function of the cooking apparatus 100, the data may be stored in a memory that can be attached to or detached from the cooking apparatus 100. Meanwhile, in the case of a memory embedded in the cooking apparatus 100, the memory may be implemented as at least one of a volatile memory (e.g.: a dynamic RAM (DRAM), a static RAM (SRAM), or a synchronous dynamic RAM (SDRAM), etc.) or a non-volatile memory (e.g.: an one time programmable ROM (OTPROM), a programmable ROM (PROM), an erasable and programmable ROM (EPROM), an electrically erasable and programmable ROM (EEPROM), a mask ROM, a flash ROM, a flash memory (e.g.: NAND flash or NOR flash, etc.), a hard drive, or a solid state drive (SSD)). In the case of a memory that can be attached to or detached from the cooking apparatus 100, the memory may be implemented as forms such as a memory card (e.g., compact flash (CF), secure digital (SD), micro secure digital (Micro-SD), mini secure digital (Mini-SD), extreme digital (xD), multimedia card (MMC), etc.), an external memory that can be connected to a USB port (e.g., a USB memory), etc.

The heating part 140 may include a heater that combusts gas and heats the inside of the kitchen, a cooktop that converts electric energy into heat energy and heats a cooking substance, a microwave generator that irradiates microwaves inside the kitchen, and a steam generator that emits heated steam inside the kitchen. Also, the heating part 140 may comprise induction coils, and may generate at least one of a magnetic field or an electric field for heating a container placed on the cooking apparatus 100.

However, the heating part 140 does not include all of a heater, a cooktop, a microwave generator, and a steam generator, but depending on the types of the cooking apparatus 100, the heating part 140 may be implemented as a form including at least one of a heater, a cooktop, a microwave generator, or a steam generator.

Meanwhile, the heating part 140 may be located in an area different from the input panel among the upper plate panels of the cooking apparatus 100. Also, here, the heating part 140 may be referred to as a burner or a burner part.

The communication apparatus 150 may include a communication module communicating with an external electronic apparatus by using various communication protocols.

The communication apparatus 150 is a component performing communication with various types of external apparatuses according to various types of communication methods. The communication apparatus 150 may include a Wi-Fi module, a Bluetooth module, an infrared communication module, a wireless communication module, etc. Here, each communication module may be implemented in the form of at least one hardware chip.

The processor 120 may perform communication with various kinds of external apparatuses by using the communication apparatus 150. Here, an external apparatus may include a display apparatus such as a TV, an image processing apparatus such as a set-top box, an external server, a control apparatus such as a remote control, an audio output apparatus such as a Bluetooth speaker, an illumination apparatus, a home appliance such as a smart refrigerator, a server such as an IOT home manager, etc.

A Wi-Fi module and a Bluetooth module perform communication respectively by a Wi-Fi method and a Bluetooth method. In the case of using a Wi-Fi module or a Bluetooth module, various kinds of connection information such as SSID and a session key may be transmitted and received first, and communication may be connected by using this, and then various kinds of information may be transmitted and received.

An infrared communication module performs communication by an infrared data association (IrDA) technology of transmitting data wirelessly to the near field by using infrared rays existing between rays and millimeter waves.

A wireless communication module may include at least one communication chip performing communication according to various wireless communication protocols such as Zigbee, 3rd Generation (3G), 3rd Generation Partnership Project (3GPP), Long Term Evolution (LTE), LTE Advanced (LTE-A), 4th Generation (4G), 5th Generation (5G), etc.

Other than the above, the communication apparatus 150 may include at least one of a local area network (LAN) module, an Ethernet module, or a wired communication module performing communication by using pair cables, coaxial cables, or optical fiber cables, etc.

According to an embodiment of the disclosure, the communication apparatus 150 may use the same communication module (e.g., a Wi-Fi module) for communicating with an external apparatus such as a remote control and an external server.

According to another embodiment of the disclosure, the communication apparatus 150 may use a different communication module (e.g., a Wi-Fi module) for communicating with an external apparatus such as a remote control and an external server. For example, the communication apparatus 150 may use at least one of an Ethernet module or a Wi-Fi module for communicating with an external server, and may use a BT module for communicating with an external apparatus such as a remote control. However, this is merely an example, and the communication apparatus 150 may use at least one communication module among various communication modules in the case of communicating with a plurality of external apparatuses or external servers.

Figure 3:
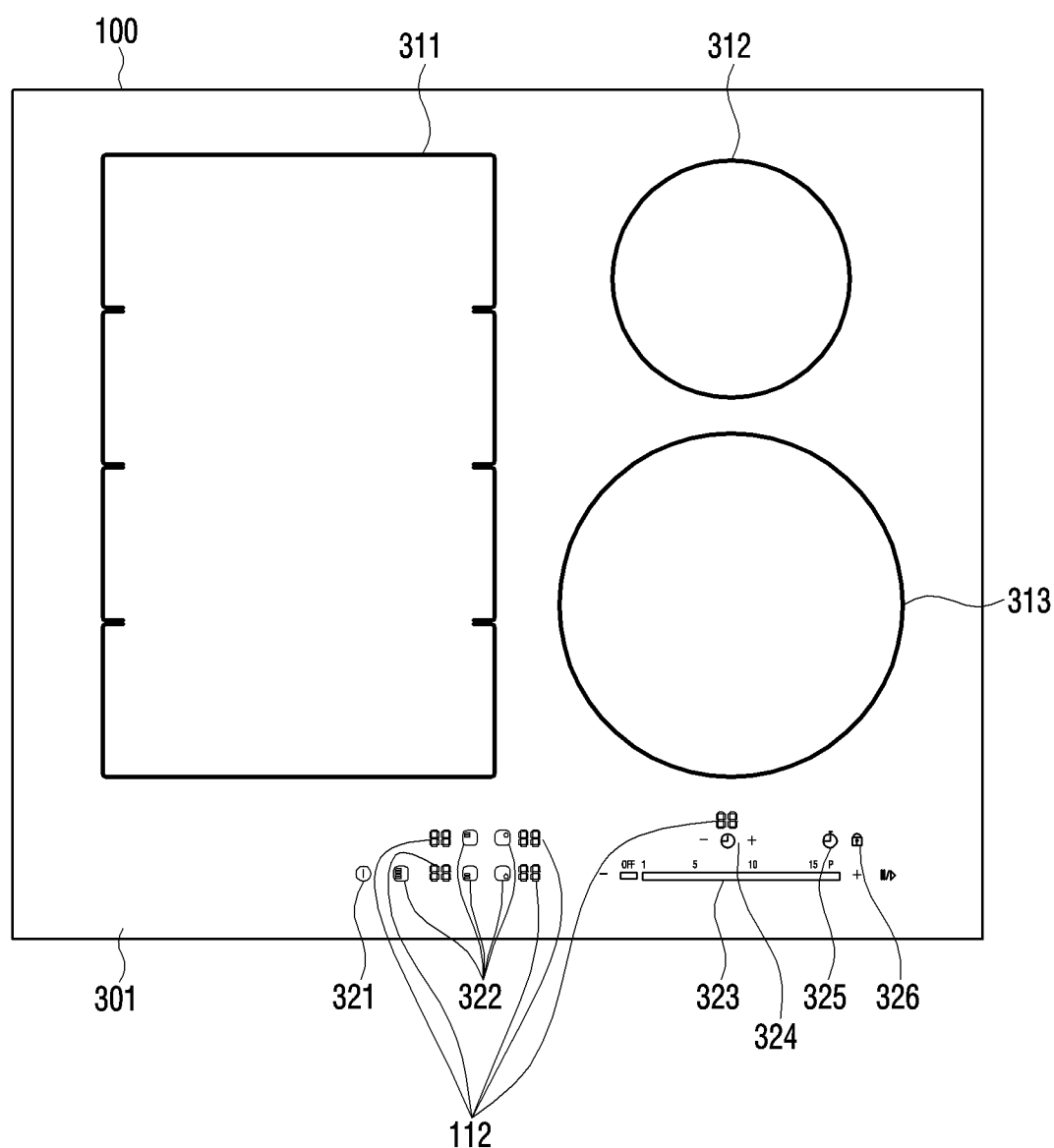
FIG. 3 is a diagram for illustrating the physical components included in the cooking apparatus in FIG. 1 according to an embodiment.

FIG. 3 is a diagram for illustrating the physical components included in the cooking apparatus in FIG. 1.

Referring to FIG. 3, the cooking apparatus 100 may include a plurality of displays 112, a glass 301, a plurality of heating parts 311, 312, 313, a power button 321, a plurality of manipulation buttons 322, a heating strength adjustment button 323, a time adjustment button 324, a timer setting button 325, and a manipulation lock button 326. Here, the aforementioned plurality of buttons may mean a display area performing the function of informing the location of a touch or a touch pad corresponding to a specific display area. For example, the aforementioned plurality of buttons may mean a mark printed for informing the location of a touch pad corresponding to the plurality of buttons, and also, may mean a touch pad corresponding to a printed mark. As will be described later with reference to FIG. 4, a printed mark may be displayed in the upper end of the glass 301 as 320 in FIG. 4, and a touch pad may be arranged in the lower end of the glass 301. In this specification, the feature of touching a button may mean directly touching a specific location among the upper end portions of the glass, and also, may mean generating a change of the capacitance of the touch pad by touching a specific location.

Meanwhile, the plurality of buttons may be at least one of a button displayed on the touch screen, a touch button, or a physical button.

The plurality of displays 112 may display specific information, and specific information may mean the temperature of the heating part, and time information. For example, if the heating part of the cooking apparatus 100 operates by a user input, the cooking apparatus 100 may display the temperature of a specific heating part through the display. As another example, if a user input using a timer function is received at a specific heating part, the cooking apparatus 100 may display time information on the display corresponding to the specific heating part.

The glass 301 may mean the external surface of the cooking apparatus 100 on which the plurality of displays 112, the power button 321, the plurality of manipulation buttons 322, the heating strength adjustment button 323, the time adjustment button 324, the timer setting button 325, and the manipulation lock button 326 are displayed. Here, the glass 301 may be replaced with a separate substance according to the various functions of the cooking apparatus.

The plurality of heating parts 311, 312, 313 may be in shapes or sizes different from one another. As an example, the first heating part 311 may be in a square shape, and all areas in square shapes may fall under heating areas. As another example, the first heating part 311 may comprise two heating areas such as an upper side heating area and a lower side heating area. Meanwhile, the second heating part 312 and the third heating part 313 may be in circle shapes. Also, the cooking apparatus 100 may include displays and manipulation buttons corresponding to each of the first heating part 311, the second heating part 312, and the third heating part 313.

The power button 321 may be a button for changing the power of the entire cooking apparatus 100 to a turned-on state or a turned-off state. As an example, if the cooking apparatus 100 identifies that the power button 321 was touched while the power of the cooking apparatus 100 is turned off, the cooking apparatus 100 may be changed to a standby mode. Also, if it is identified that a manipulation button corresponding to a specific heating part was touched, the cooking apparatus 100 may change the specific heating part to an operation mode. Here, a standby mode may mean a state of making preparation such that the cooking apparatus 100 can use the heating part while only minimum power is supplied. Also, an operation mode may mean a state wherein the cooking apparatus 100 applies heat to a specific area.

The plurality of manipulation buttons 322 may be buttons for controlling a specific heating part. As an example, if the cooking apparatus 100 identifies that a manipulation button corresponding to the second heating part 312 was touched by a user input, the cooking apparatus 100 may perform control such that power is supplied to the second heating part 312 and heat is applied to an area corresponding to the second heating part 312. Here, if the cooking apparatus 100 identifies that a manipulation button corresponding to a specific heating part was touched by a user input, the cooking apparatus 100 may control the specific heating part such that heat corresponding to a predetermined temperature is applied. In case a temperature which is not a predetermined temperature is desired, the heating strength adjustment button 323 may be used.

The heating strength adjustment button 323 is a button for setting the temperature of heat applied to a specific heating part. As an example, if a user input is received through the heating strength adjustment button 323, the cooking apparatus 100 may adjust the temperature of heat applied to a specific heating part.

The time adjustment button 324 may be a button for a timer function. As an example, a user may set the time when a specific heating part operates as a predetermined time or a time input by the user.

The timer setting button 325 may be a trigger button for setting a timer function. For example, if the cooking apparatus 100 receives a user input through the timer setting button 325, the cooking apparatus 100 may control a specific heating part such that a timer function is performed at the specific heating part. Also, when a user input is received through the time adjustment button 324, the cooking apparatus 100 may control the specific heating part to operate only for the time corresponding to the user input.

The manipulation lock button 326 may be a button for controlling the cooking apparatus 100 such that a user input cannot be received through a plurality of buttons included in the cooking apparatus 100. When a user input is received through the manipulation lock button 326, the cooking apparatus 100 may inactivate all buttons excluding the manipulation lock button 326. In this case, even if a user touches other buttons excluding the manipulation lock button 326, the cooking apparatus 100 may not receive a user input. Here, if a user input is received through the manipulation lock button 326 while the manipulation lock function is being performed, the cooking apparatus 100 may activate all buttons.

Figure 4:
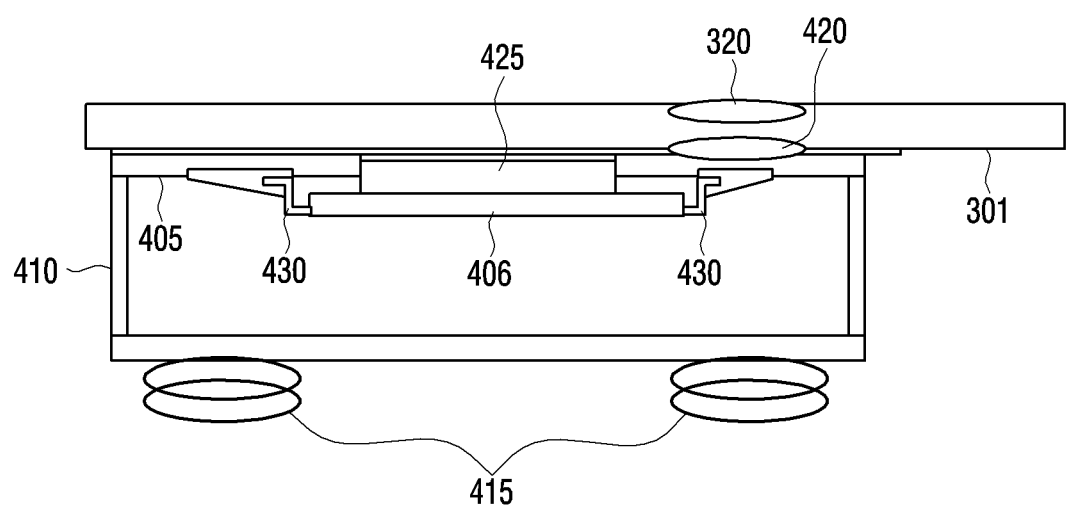
FIG. 4 is a diagram for illustrating a touch configuration of a cooking apparatus according to an embodiment.

FIG. 4 is a diagram for illustrating a touch configuration of a cooking apparatus according to an embodiment of the disclosure.

Referring to FIG. 4, the cooking apparatus 100 may include a glass 301, a button 320, a printed circuit board (PCB) 405, 406, an injection molding product (a PCB support) 410, a spring 415, a touch pad 420, a light emitting diodes (LED) reflector 425, and a lead part 430. Here, the button 320 may fall under a mark for informing a user about the location of the touch pad 420, and may be implemented as a form wherein a specific mark is printed (or attached) on the glass 301.

Referring to FIG. 4, the cooking apparatus 100 may be implemented as a PCB-contact structure. Specifically, a PCB-contact structure may be a structure wherein the glass 301 and the PCB 405 are assembled to contact each other. The touch pad 420 receiving inputs of each of a plurality of buttons may be formed in the upper part of the PCB 405, and the touch pad 420 formed on the PCB 405 may be formed to contact the lower part of the glass 301. Also, the PCB 405 may be supported by the injection molding product 401, and in the lower part of the injection molding product 410, the spring 415 may be arranged. Here, the touch pad 420 may mean a touch pad copper foil. The spring 415 pushes the injection molding product 410 upward, and the PCB 405 supported by the injection molding product 410 comes into contact with the glass 301 by the pushing force of the spring 415.

Meanwhile, the cooking apparatus 100 may include a plurality of PCBs 405, 406. Also, the cooking apparatus 100 may include a main PCB 405 and a sub PCB 406. Here, the main PCB 405 may include at least one of the touch pad 420, a MICOM (not shown), or an LED, and the sub PCB 406 may include an LED reflector 425.

The LED reflector 425 performs the function of reflecting lights emitted by an LED and collecting the lights, and may be arranged on the sub PCB 406. However, according to another embodiment of the disclosure, the LED reflector 425 may be implemented as a form of being arranged on the main PCB 405, but not the sub PCB 406.

Also, the cooking apparatus 100 may include a lead part 430 connecting the main PCB 405 and the sub PCB 406. Here, the lead part 430 may be an electronic circuit line (or a communication circuit line) for connecting the main PCB 405 and the sub PCB 406. In a PCB-contact structure, the degree of contact between the glass 301 and the touch pad 420 may vary by assembly tolerance according to the elasticity of the spring 415, the degree of bending of the injection molding product 410, or the degree of bending of the glass 301. Also, in a PCB-contact structure, the degree of contact between the glass 301 and the touch pad 420 may vary by assembly tolerance according to the degree of seated assembly of the injection molding product 410 and the PCB 405.

Accordingly, in a PCB-contact structure, an air gap may be generated between the glass 301 and the touch pad 420, and a problem that the touch sensitivity of a specific button 320 varies according to the size of an air gap may occur. That is, according to an air gap that may occur in a PCB-contact structure, the touch sensitivity of a specific button may be bad. Meanwhile, in FIG. 4, the input panel 110 may be implemented as a form of including the glass 301, the button 320, and the touch pad 420. However, the disclosure is not necessarily limited thereto, and the components of the input panel 110 may be changed according to the types of the cooking apparatus 100.

Figure 5:
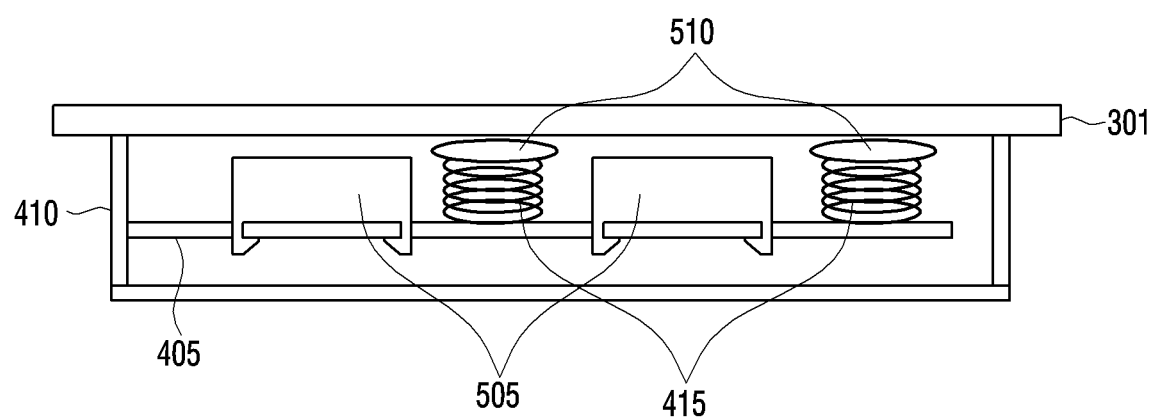
FIG. 5 is a diagram for illustrating a touch configuration of a cooking apparatus according to another embodiment.

FIG. 5 is a diagram for illustrating a touch configuration of a cooking apparatus according to another embodiment of the disclosure.

Referring to FIG. 5, the cooking apparatus 100 may include a glass 301, a printed circuit board (PCB) 405, an injection molding product (a PCB support) 410, a spring 415, a light emitting diode (LED) module 505, and a touch pad 510. Here, the LED module 505 may include an LED reflector. Also, the touch pad 510 may be a touch pad metal plate.

Referring to FIG. 5, the cooking apparatus 100 may be a spring-type structure. Also, the touch pad 510 may be constituted to contact the spring 415, and by contact between the spring 415 and the glass 301, a user input may be received at the touch pad 510.

In a spring-type structure, contact with respect to a plurality of buttons may also vary by the upper part of the spring 415 and the glass 301 due to assembly tolerance according to the elasticity of the spring 415 or the degree of bending of the glass 301. Also, in case contact in a partial area varies, a problem that the touch sensitivity of each button that a user feels also varies may occur.

Meanwhile, in FIG. 4, the button 320 was described as a separate printed mark area, and in FIGS. 4 and 5, it was described that the LED module and the touch pad are arranged in different locations from each other. However, the input panel 110 may be implemented as, for example, a touch screen panel in a capacitive type, and may detect a change of the capacitance corresponding to a user input (a finger or a touch rod (a test apparatus)). The input panel 110 may determine the contact location of the user input based on the detected change of the capacitance.

In case there is a button of which touch sensitivity is not good due to the assembly tolerance as described in FIGS. 4 and 5, consumers may feel inconvenience. For solving such a problem fundamentally, there may be a method of disassembling the cooking apparatus 100 and then reassembling it. However, in this case, there are problems that the process of disassembling the cooking apparatus 100 and then reassembling it is inconvenient and may take a lot of time, and general consumers cannot easily solve this.

The cooking apparatus 100 according to an embodiment of the disclosure may find a problem regarding a button of which touch sensitivity is not good through a touch sensitivity inspection, and solve the problem by adjusting the threshold value to an appropriate threshold value. Also, the cooking apparatus 100 according to an embodiment of the disclosure may change touch sensitivity in terms of software without disassembly.

Figure 6:
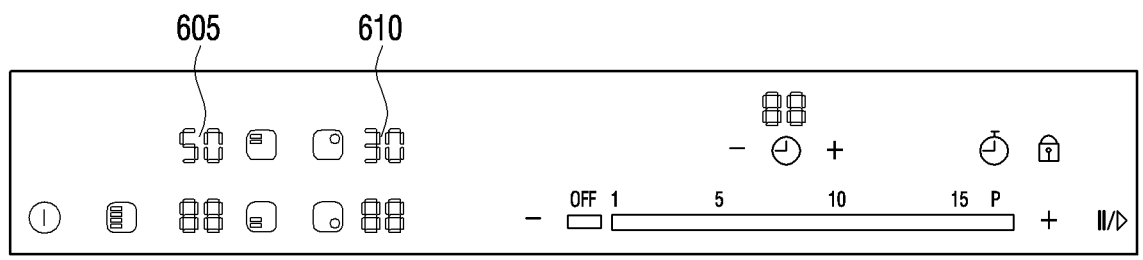
FIG. 6 is a diagram for illustrating a method of using a display according to an embodiment.

FIG. 6 is a diagram for illustrating a method of using a display according to an embodiment of the disclosure.

Referring to FIG. 6, the cooking apparatus 100 may use the display included in the cooking apparatus 100 while proceeding with the calibration mode. The cooking apparatus 100 may perform control such that the threshold value of a specific button and the signal value of the current user input are displayed on at least one predetermined display among the plurality of displays included in the cooking apparatus 100.

The plurality of touch buttons included in the cooking apparatus 100 have intrinsic threshold values, and the threshold values may be determined by a predetermined method. According to an embodiment of the disclosure, the threshold value of a specific button may be the same for each of the plurality of buttons. Meanwhile, according to another embodiment of the disclosure, the threshold value of a specific button may be different for each of the plurality of buttons.

Also, when a user input is received for a specific button in the calibration mode, the cooking apparatus 100 may receive the received user input. Then, the cooking apparatus 100 may identify a signal value corresponding to the received user input. When the cooking apparatus identifies the signal value of the user input, the cooking apparatus 100 may display at least one of the threshold value of a specific button or the received signal value on the display included in the cooking apparatus 100. In case both of the threshold value of a specific button and the signal value of the user input are displayed on the display, the user can easily determine whether the specific button is normal. In case the signal value of the user input is smaller than the threshold value of the specific button, the cooking apparatus 100 may determine that the specific button is in a broken state.

As an example, it will be assumed that an inspection of the touch sensitivity for the first button is performed in the calibration mode. Here, when a user input is received for the first button, the cooking apparatus 100 may receive the user input for the first button, and identify the signal value of the user input for the first button. When the cooking apparatus 100 identifies the signal value of the user input for the first button, the cooking apparatus 100 may display a threshold value (e.g., 50) corresponding to the touch sensitivity of the first button on the first display 605. Then, the cooking apparatus 100 may display the identified signal value (e.g., 30) of the user input for the first button on the second display 610. Here, if it is identified that the signal value of the user input for the first button is 30 and the threshold value of the first button is 50, the cooking apparatus 100 may identify that the button was not touched. Then, based on the fact that the user input for the first button was not identified as a normal touch, the cooking apparatus 100 may determine that the touch sensitivity of the first button is abnormal. That is, the cooking apparatus 100 may determine that the function of the first button does not operate properly.

In case both of the threshold value of a specific button and the signal value of a user input are displayed on the display, the user can easily figure out to which value the threshold value should be adjusted. For example, in the aforementioned embodiment, the user may directly change the threshold value of the first button to a value smaller than 30. Meanwhile, according to another embodiment of the disclosure, the cooking apparatus 100 may automatically change the threshold value of the first button to a value smaller than the identified signal value of a user input without a user's setting.

Figure 7:
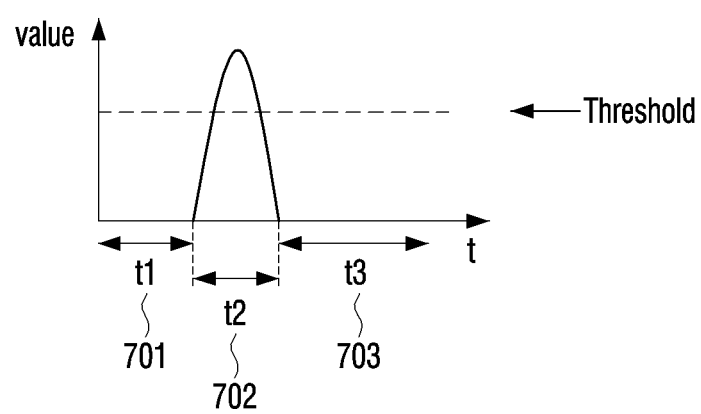
FIG. 7 is a diagram for illustrating an operation that a specific button is touched normally based on the threshold value of the specific button according to an embodiment.

FIG. 7 is a diagram for illustrating an operation that a specific button is touched normally based on the threshold value of the specific button.

Referring to FIG. 7, for a specific button, the threshold value of the specific button may have been set. For the convenience of explanation, the set threshold value of a specific button will be referred to as the threshold value of a specific button.

In case a user touches a specific button for performing an inspection for the specific button, the cooking apparatus 100 may receive the touch input, and the cooking apparatus 100 may identify a signal value corresponding to the received touch input. Here, the signal value may mean the result of converting the size of the signal for the touch input into a value. The conversion method may vary according to the cooking apparatus or the method of a touch input by a predetermined method.

Figure 8:
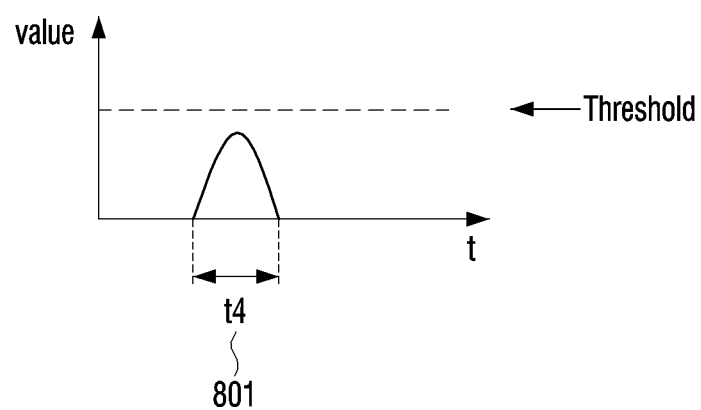
FIG. 8 is a diagram for illustrating an operation that a specific button is not touched normally based on the threshold value of the specific button according to an embodiment.

In the diagrams illustrated in FIGS. 7 and 8, the horizontal axis may mean the time, and the vertical axis may mean a signal value. Here, a signal value corresponding to the vertical axis may mean various values depending on implementation examples. For example, a signal value corresponding to the vertical axis may indicate at least one of a capacitance, an amount of change of a capacitance, the charging time of a capacitance or the value of the cycle of charging and discharging of a capacitance, or a current or voltage value applied to a touch sensor, or a signal corresponding thereto.

As an example, a signal value may mean the value of change of a capacitance. In case there is no touch input of a user, the amount of change may correspond to 0. In case a touch input of a user is received, the cooking apparatus 100 may identify whether the user touched a specific button based on the increase of the amount of change of the capacitance.

As another example, a signal value may be the charging time of a capacitance. The cooking apparatus 100 may repeat charging and discharging by a constant time unit, and identify the time from the starting point of charging to the completion point of charging as the charging time. Here, the feature that the charging time is long may mean that the capacity of the capacitance is big, and may also mean that the strength of the touch input is big. That is, as the strength of a user's touch is stronger, the charging time may become longer.

Meanwhile, as still another example, a signal value may be the value of the cycle that charging and discharging of a capacitance is repeated. For example, in case charging and discharging is performed repeatedly, the time that charging and discharging occurs once may be measured by the cooking apparatus 100. Also, in case there is a touch input of a user as described above, the charging time may change due to the change of the capacitance and the time that charging and discharging occurs once may change. In this case, there may be a change in the value of the cycle that charging and discharging of the capacitance is repeated, and based on such a value of change, the cooking apparatus 100 may identify whether the user touched a specific button.

Meanwhile, as still another example, a signal value may mean a current value or a voltage value. That is, a signal value may mean a current or voltage value used in charging and discharging a capacitance.

Meanwhile, in the aforementioned embodiment, it was described that a signal value or the strength of a signal means at least one of an amount of change of a capacitance, the charging time of a capacitance (or the value of the cycle of charging and discharging of a capacitance), or a current value or a voltage value, but in actual implementation, a signal value may be a value in a form modified based on at least one of the aforementioned information. Also, a signal value may correspond to various values that can identify whether there was a touch other than the aforementioned information.

Also, it will be assumed that the time of performing an inspection for a specific button is divided as a first section 701, a second section 702, and a third section 703. Here, the first section 701 and the second section 702 may be divided based on the time point when a user input was initially received. For example, the cooking apparatus 100 may set the time period from the time point when an inspection for a specific button started to the time point when a user input was initially received as the first section 701, and set the time period from the time point when a user input was initially received to the time point when a user input was not received any longer as the second section 702. Also, the cooking apparatus 100 may set the time period from the time point when a user input was not received any longer to the time point when a predetermined time passed as the third section 703.

The first section 701 is a section wherein an inspection for a specific touch button started, but a touch input was not yet received at the cooking apparatus 100. The second section 702 is a section wherein a user input for the specific button was received. Meanwhile, the third section 703 may mean a section after a user input was touched. In the second section 702, the cooking apparatus 100 may receive a touch input of the specific button for the inspection of the specific button. Then, the cooking apparatus 100 may identify the signal value of the received touch input, and compare the identified signal value with the threshold value of the specific button. As illustrated in FIG. 7, in case the maximum value among the signal values identified in the second section 702 is bigger than the threshold value of the specific button, the cooking apparatus 100 may determine that the specific button is normal.

According to still another example, the cooking apparatus 100 may perform an inspection of a specific button by comparing the average value of the signal values identified in the second section 702 with the threshold value of the specific button. For example, if the cooking apparatus 100 identifies that the average value of the signal values identified in the second section 702 is bigger than the threshold value of a specific button, the cooking apparatus 100 may determine that the specific button is normal. In performing an inspection of a specific button, which of the maximum value or the average value will be used may vary depending on selection of a user.

Meanwhile, in FIG. 7, it was expressed that a user input is received in the second section 702 and is not received in the third section 703. However, in another embodiment of the disclosure, a user input may start to be received in the second section 702 and may be continuously received in the third section 703. For example, for inspection of a specific button, a user may continuously touch the specific button. Here, if a user input is continuously received, it may be difficult to distinguish the second section 702 and the third section 703. In this case, the cooking apparatus 100 may set the time period from the first time point when a user input was initially received to the second time point when a predetermined first time passed based on the first time point as the second section 702, and set the time period from the second time point to the third time point when a predetermined second time passed based on the second time point as the third section 703.

FIG. 8 is a diagram for illustrating an operation that a specific button is not touched normally based on the threshold value of the specific button.

The horizontal axis in the diagram illustrated in FIG. 8 may mean the time, and the vertical axis may mean a signal value corresponding to a received user input. The fourth section 801 illustrated in FIG. 8 may correspond to the second section 702 in FIG. 7. That is, the fourth section 801 may mean the time period from the time point when a user input for a specific button was initially received to the time point when a user input was not received any longer. Referring to FIG. 8, the cooking apparatus 100 may identify that the maximum value among the signal values corresponding to the received user inputs does not exceed the threshold value of a specific button. In this case, the cooking apparatus 100 may determine that the specific button is not normal (in a broken state).

Meanwhile, according to another embodiment of the disclosure, the cooking apparatus 100 may determine whether the average value (the first input value) of the signal values of user inputs received in the fourth section 801 is bigger than the threshold value of a specific button. If the first input value is bigger than the threshold value of a specific button, the cooking apparatus 100 may determine that the specific button is normal. Meanwhile, if the first input value is smaller than the threshold value of a specific button, the cooking apparatus 100 may determine that the specific button is abnormal. Here, if the first input value is smaller than the threshold value of a specific button, the cooking apparatus 100 may determine whether the maximum value (the second input value) among the signal values of user inputs received in the fourth section 801 is bigger than the threshold value of a specific button. If the second input value is bigger than the threshold value of a specific button, the cooking apparatus 100 may determine that the specific button is normal. Meanwhile, if the second input value is smaller than the threshold value of a specific button, the cooking apparatus 100 may determine that the specific button is abnormal. If the cooking apparatus 100 considers the maximum value supplementarily other than the average value, the cooking apparatus 100 may control touch sensitivity in detail. In the case of using the average value, touch sensitivity may not be sensitive. However, in the case of using the maximum value, touch sensitivity may be sensitive. A user of the cooking apparatus 100 may determine whether to perform an inspection by using the average value or perform an inspection by using the maximum value in consideration of the degree of touch sensitivity.

Figure 9:
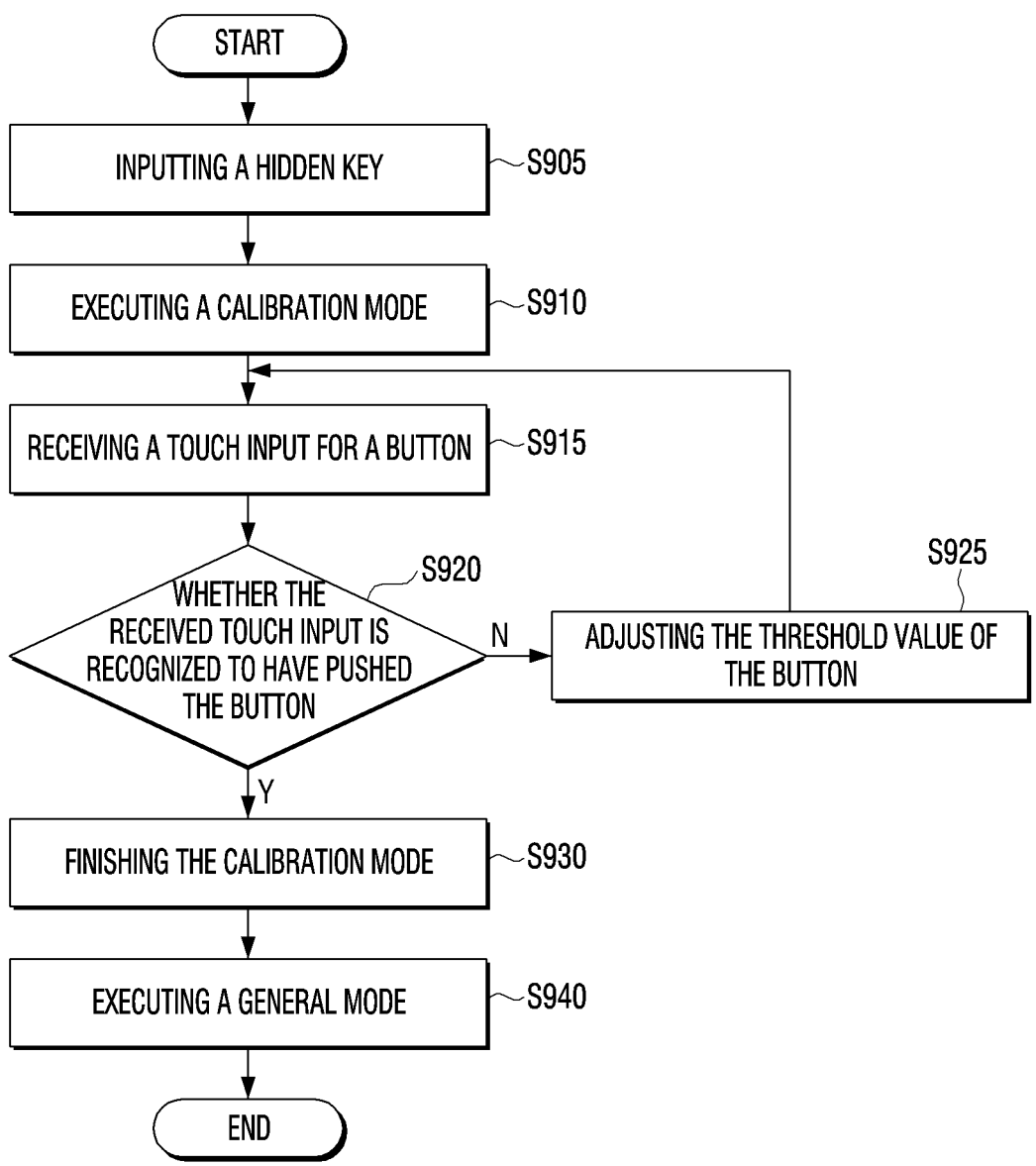
FIG. 9 is a diagram for illustrating a controlling method of a cooking apparatus adjusting a threshold value of a specific button according to an embodiment.

FIG. 9 is a diagram for illustrating a controlling method of a cooking apparatus adjusting a threshold value of a specific button.

Referring to FIG. 9, the cooking apparatus 100 may receive an input of a hidden key by a user from the input panel 110 at operation S905. In case the cooking apparatus 100 receives an input of a hidden key by a user from the input panel 110, the cooking apparatus 100 may execute the calibration mode at operation S910. Also, the cooking apparatus 100 may perform a touch sensitivity inspection for a specific button in the calibration mode.

Further, after the calibration mode was executed, the cooking apparatus 100 may receive a touch input for a specific button by the user at operation S915. Here, a touch input may mean that a specific button was touched by the user's hand, or it may mean that a specific button was touched through a touch rod (or a separate touch test apparatus).

Here, the cooking apparatus 100 may identify whether it is recognized that the touch input of the user pushed a specific button (a specific button was touched) at operation S920. Specifically, in case a signal value (a sensing value) corresponding to the touch input is bigger than a predetermined threshold value, the cooking apparatus 100 may determine (identify) that a specific button was touched by the touch input of the user. Also, in case a signal value (a sensing value) corresponding to the touch input is smaller than a predetermined threshold value, the cooking apparatus 100 may determine that a specific button was not pushed by the touch input of the user.

The operation S920 may correspond to an operation of determining whether a specific button was touched normally. In case the cooking apparatus 100 identified that a specific button was touched by a received touch input, the cooking apparatus 100 may determine that the specific button was touched normally and determine that the touch sensitivity of the specific button is good. Meanwhile, if the cooking apparatus 100 identifies that a received touch input did not touch a specific button normally, the cooking apparatus 100 may determine that the specific button is abnormal (or in a broken state) and determine that the touch sensitivity of the specific button is not good.

Here, in case it was determined that a specific button was not pushed by the touch input of the user, the cooking apparatus 100 may adjust the threshold value of the specific button at operation S925. Specifically, the cooking apparatus 100 may change the threshold value for the specific button such that the signal value of the touch input becomes bigger than the threshold value. Then, according to an embodiment of the disclosure, the cooking apparatus 100 may receive a new touch input for the specific button. Meanwhile, in case it was determined that the specific button was touched by the touch input of the user, the cooking apparatus 100 may finish the calibration mode at operation S930.

Meanwhile, according to another embodiment of the disclosure, the cooking apparatus 100 may make comparison with a changed threshold value based on the previous touch input for a specific button. For example, the cooking apparatus 100 may identify whether the signal value for the previous touch input is bigger than a changed (adjusted) threshold value and thereby determine whether a specific button was pushed. Here, in case the signal value for the previous touch input is smaller than the changed (adjusted) threshold value, the cooking apparatus 100 may determine that the specific button was not pushed. Then, the cooking apparatus 100 may adjust the threshold value of the specific button again. However, in case the signal value for the previous touch input is bigger than the changed (adjusted) threshold value, the cooking apparatus 100 may determine that the specific button was touched. Then, the cooking apparatus 100 may finish the calibration mode.

In case the cooking apparatus 100 finishes the calibration mode, the cooking apparatus 100 may execute a general mode after the calibration mode is finished at operation S940. The cooking apparatus 100 may perform control such that a specific button is pushed normally through an operation of maintaining or changing the threshold value of the specific button. According to the controlling method of the cooking apparatus 100 according to FIG. 9, the cooking apparatus 100 may automatically perform control such that a specific button operates normally. As a user does not have to directly set the threshold value of a specific button, a user's convenience can be improved.

Figure 10:
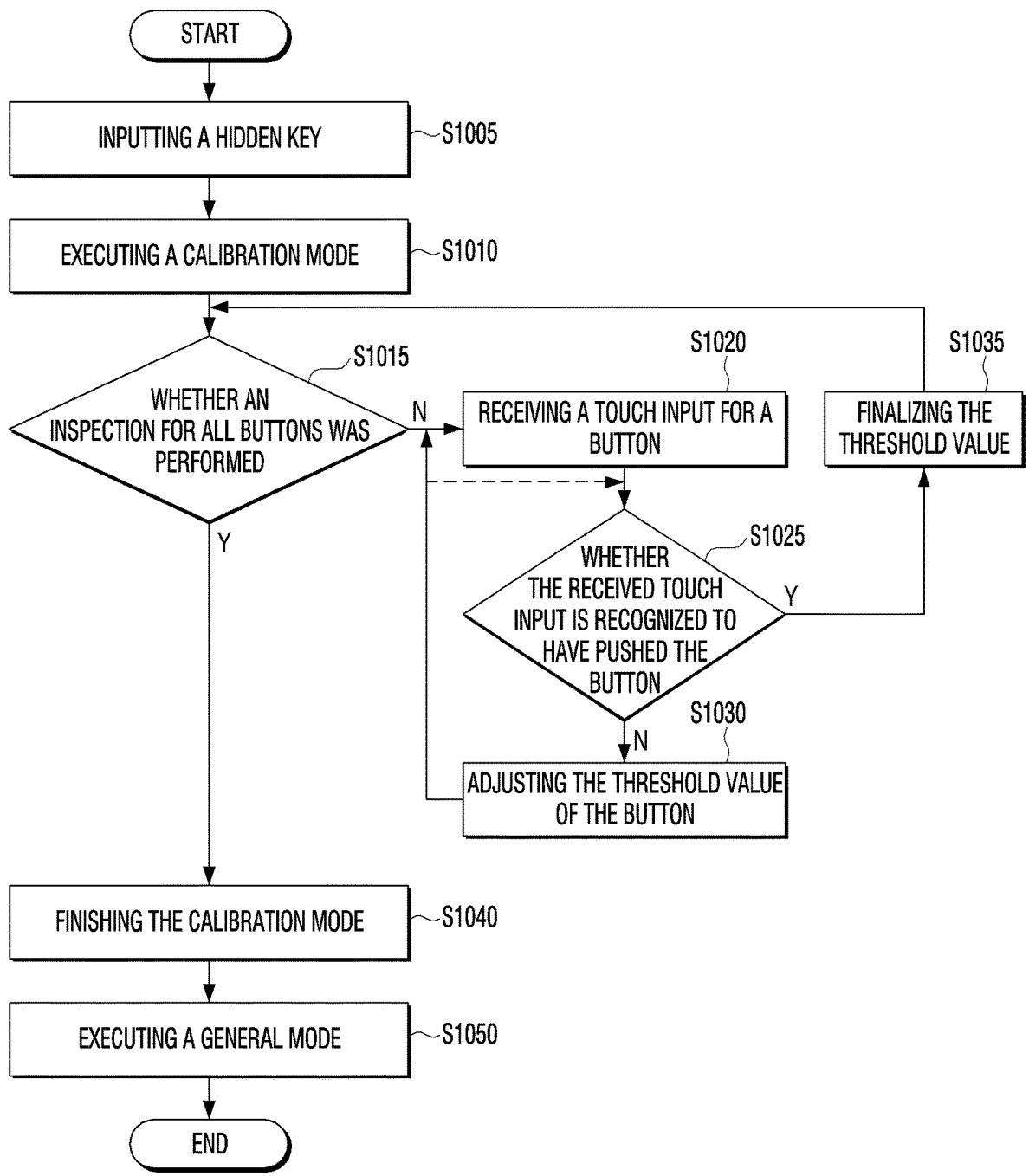
FIG. 10 is a diagram for illustrating a controlling method of a cooking apparatus performing inspection for a plurality of buttons included in a cooking apparatus according to an embodiment.

FIG. 10 is a diagram for illustrating a controlling method of a cooking apparatus performing inspection for a plurality of buttons included in a cooking apparatus.

The cooking apparatus 100 may receive an input of a hidden key by a user at operation S1005. Then, when the cooking apparatus 100 receives an input of a hidden key, the cooking apparatus 100 may execute the calibration mode at operation S1010.

Further, the cooking apparatus 100 may perform a touch sensitivity inspection for all buttons included in the cooking apparatus 100. Specifically, the cooking apparatus 100 may determine whether a touch sensitivity inspection for all buttons was performed at operation S1015. If the cooking apparatus 100 determines that a touch sensitivity inspection for all buttons was performed at the operation S1015, the cooking apparatus 100 may finish the calibration mode at operation S1040. Then, the cooking apparatus 100 may execute a general mode at operation S1050. If the cooking apparatus 100 determines that a touch sensitivity inspection for all buttons was not performed, the cooking apparatus 100 may perform an inspection for a specific button among the plurality of buttons included in the cooking apparatus 100 based on a predetermined order. Also, for an inspection for a specific button, the cooking apparatus 100 may receive a touch input of a user for the specific button at operation S1020. Then, the cooking apparatus 100 may identify the signal value of the received touch input of the user.

Then, the cooking apparatus 100 may identify whether the received touch input pushed (touched) the button normally based on the identified signal value of the touch input of the user at operation S1025. Specifically, the cooking apparatus 100 may compare the threshold value of the specific button and the signal value of the touch input of the user and identify whether the button was touched. Here, in case the identified signal value of the specific button is smaller than the threshold value of the specific button, the cooking apparatus 100 may determine that the specific button was not touched by the touch input of the user. Then, the cooking apparatus 100 may adjust the threshold value of the specific button at operation S1030. Then, as an example, the cooking apparatus 100 may require a new input to the user. If the cooking apparatus 100 receives a new user input, the cooking apparatus 100 may compare a signal value corresponding to the newly received user input and the adjusted threshold value and identify whether the specific button was touched. Meanwhile, as another example, the cooking apparatus 100 may not require a new input to the user, but use the signal value of the previously received touch input of the user. Specifically, the cooking apparatus 100 may compare the signal value corresponding to the previous user input and the adjusted threshold value and identify whether the specific button was touched.

If the cooking apparatus 100 identifies that the signal value of the user input is bigger than the threshold value corresponding to the specific button, the cooking apparatus 100 may finalize the threshold value (or the adjusted threshold value) corresponding to the specific button used in the most recent comparing operation at operation S1035. When the threshold value for the specific button is finalized, the cooking apparatus 100 may identify whether an inspection for all buttons of the cooking apparatus 100 was performed. For example, when the threshold value for the first button is finalized, the cooking apparatus 100 may require a touch input for the second button to the user for finalizing the threshold value for the second button. Then, when the threshold values for all buttons are finalized, the cooking apparatus 100 may finish the calibration mode and execute a general mode.

Figure 11:
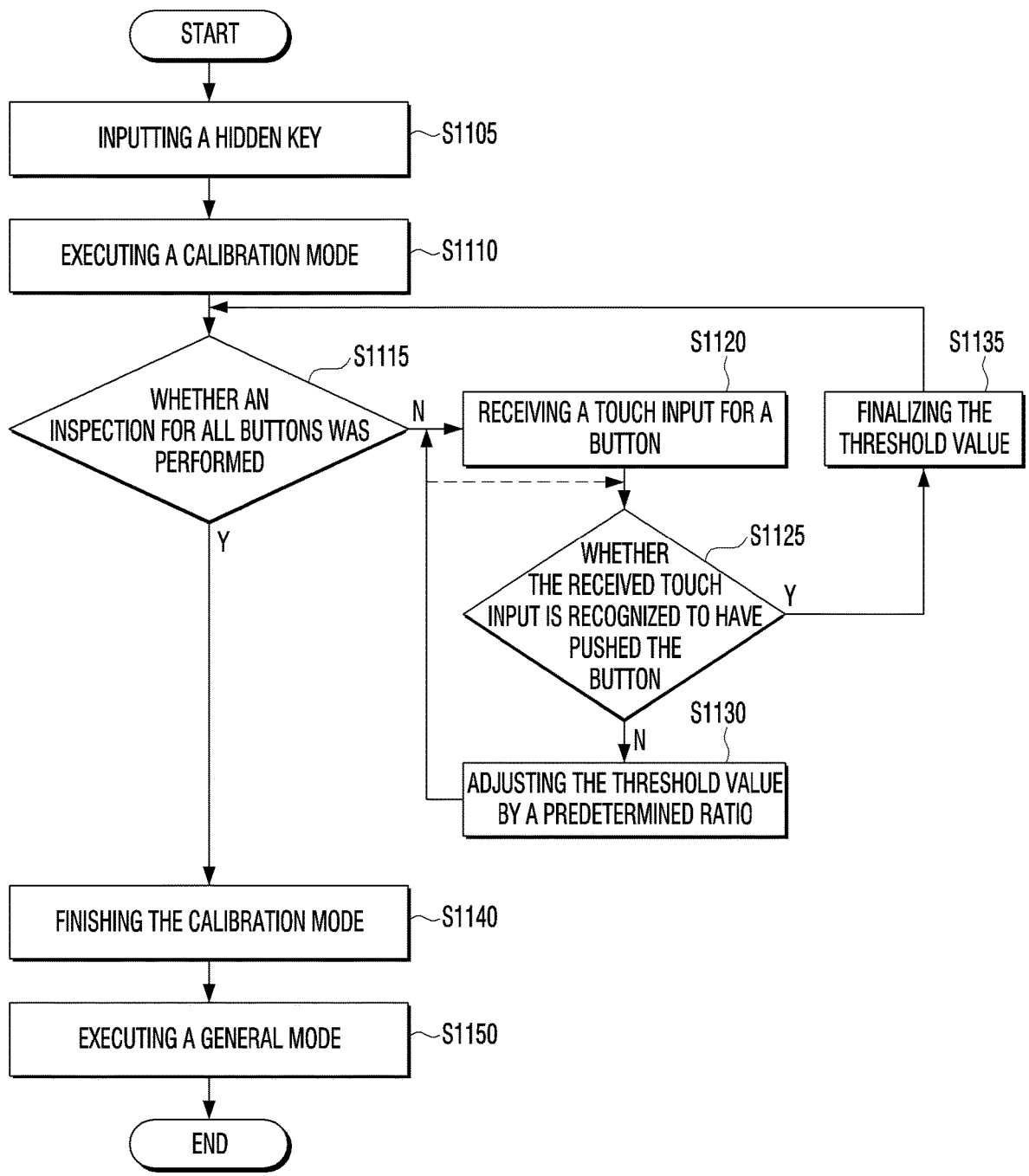
FIG. 11 is a diagram for illustrating a controlling method of a cooking apparatus adjusting a threshold value of a specific button by a predetermined ratio according to an embodiment.

FIG. 11 is a diagram for illustrating a controlling method of a cooking apparatus adjusting a threshold value of a specific button by a predetermined ratio.

The operations S1105, S1110, S1115, S1120, S1125, S1135, S1140, and S1150 described in FIG. 11 may correspond to the operations S1005, S1010, S1015, S1020, S1025, S1035, S1040, and S1050 described in FIG. 10. Accordingly, overlapping explanation for the operations S1105, S1110, S1115, S1120, S1125, S1135, S1140, and S1150 will be omitted.

Also, the operation S1130 described in FIG. 11 may correspond to the operation S1030 described in FIG. 10. At the operation S1030, only the content of adjusting a threshold value was described. If the cooking apparatus 100 identifies that a user input for a specific button did not touch the specific button, the cooking apparatus 100 may adjust the threshold value corresponding to the specific button by a predetermined ratio. Specifically, the cooking apparatus 100 may multiply the currently set threshold value of the specific button with a predetermined ratio (a number between 0 and 1) and acquire a new threshold value. For example, it will be assumed that the predetermined ratio is 0.7 and the currently set threshold value of the specific button is 50. The cooking apparatus 100 may multiply the current threshold value 50 with the predetermined ratio 0.7 and acquire a result value which is 35, and set the acquired result value 35 as the new threshold value of the specific button.

If the cooking apparatus 100 identifies that a user input did not touch the specific button even based on the new threshold value, the cooking apparatus 100 may adjust the threshold value again by multiplying the new threshold value with the predetermined ratio 0.7. Then, the operation of multiplying the threshold value with the predetermined ratio may be repeated until it is identified that a user input touched the specific button.

Figure 12:
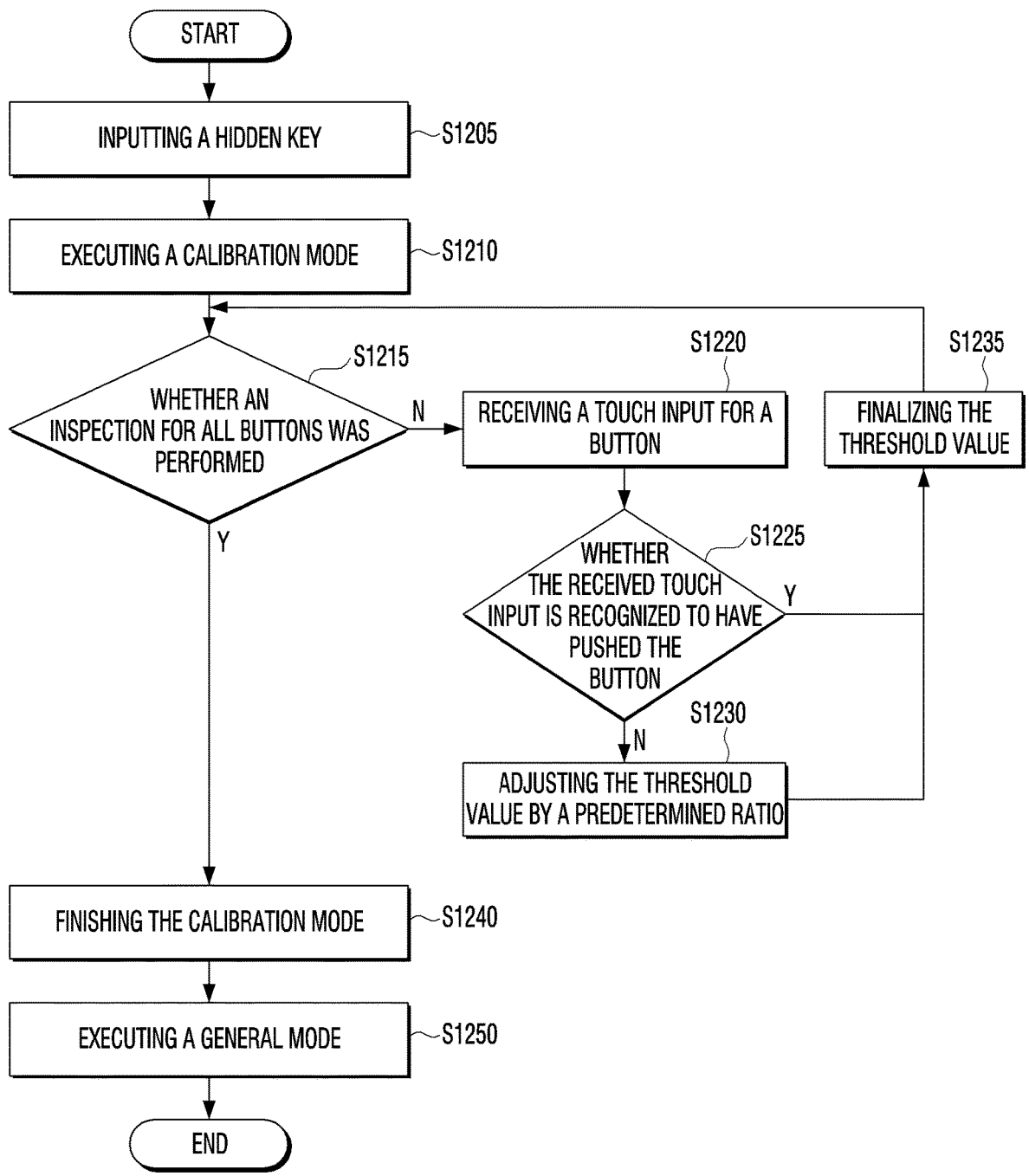
FIG. 12 is a diagram for illustrating another controlling method of a cooking apparatus adjusting a threshold value of a specific button by a predetermined ratio according to an embodiment.

FIG. 12 is a diagram for illustrating another controlling method of a cooking apparatus adjusting a threshold value of a specific button by a predetermined ratio.

Referring to FIG. 12, the operations S1205, S1210, S1215, S1220, S1225, S1230, S1235, S1240, and S1250 may correspond to the operations S1105, S1110, S1115, S1120, S1125, S1130, S1135, S1140, and S1150 described in FIG. 11. Accordingly, overlapping explanation for the operations S1205, S1210, S1215, S1220, S1225, S1230, S1235, S1240, and S1250 will be omitted.

Meanwhile, the operation S1230 may be different from the operation S1130. Referring to FIG. 12, the cooking apparatus 100 may immediately finalize the threshold value adjusted once at the operation S1230 at the operation S1235. At the operation S1130 described in FIG. 11, an operation of identifying again whether a user input (or a new user input) touched a specific button based on the threshold value adjusted once was described, but at the operation S1230 described in FIG. 12, it may not be identified again whether the specific button was touched by using the adjusted threshold value.

As the operation S1130 includes a feedback step of identifying whether the specific button was touched, the threshold value may be continuously adjusted until it is recognized that a user input touched the specific button. However, the operation S1230 does not include a feedback step of identifying whether the specific button was touched, and thus the threshold value adjusted once may be immediately finalized.

Accordingly, in an embodiment according to FIG. 12, there may be a problem that it is unclear whether a specific button is touched normally. However, in an embodiment according to FIG. 12, a user may directly select whether to adjust a threshold value.

In case a threshold value is artificially set to be too low, a side effect may occur. For example, it will be assumed that the first button is a broken component. In an embodiment according to FIG. 11, a threshold value is adjusted until it is recognized that a user input touched a specific button, and thus there may be a case wherein a threshold value becomes abnormally low. In case a threshold value falls below a predetermined value, it may be preferable to replace the first button. Accordingly, in an embodiment according to FIG. 12, if the cooking apparatus 100 identifies that an initial user input for a specific button did not touch the specific button, the cooking apparatus 100 adjusts the threshold value once by a predetermined ratio and immediately finalizes the threshold value. Then, the cooking apparatus 100 performs a touch sensitivity inspection for all buttons, and finishes the calibration mode.

Here, a user may enter the calibration mode again based on an input of a hidden key. Then, the user may perform a touch sensitivity inspection for all buttons. If it is identified that a user input did not touch a specific button based on the threshold value (or the threshold value adjusted once) of the specific button, the cooking apparatus 100 may immediately determine that the specific button is broken. Then, regarding the first button determined to be broken, the cooking apparatus 100 may provide information instructing to replace the first button immediately to the user, without changing the threshold value. The cooking apparatus 100 may provide notification for replacement to the user by a predetermined method through the display or the speaker. For example, if the cooking apparatus 100 determines that the first button is broken, the cooking apparatus 100 may perform control such that the backlight of the first button that needs to be replaced emits light, and control the speaker to output a predetermined sound.

In the case of limiting the number of times of adjusting a threshold value as in the embodiment according to FIG. 12, a user can save time spent for adjusting a threshold value, and can easily distinguish a button that necessarily has to be replaced.

Meanwhile, the controlling method according to FIG. 11 or the controlling method according to FIG. 12 may be determined according to selection of a user, and any one method may be applied to the cooking apparatus 100 by a predetermined method.

Figure 13:
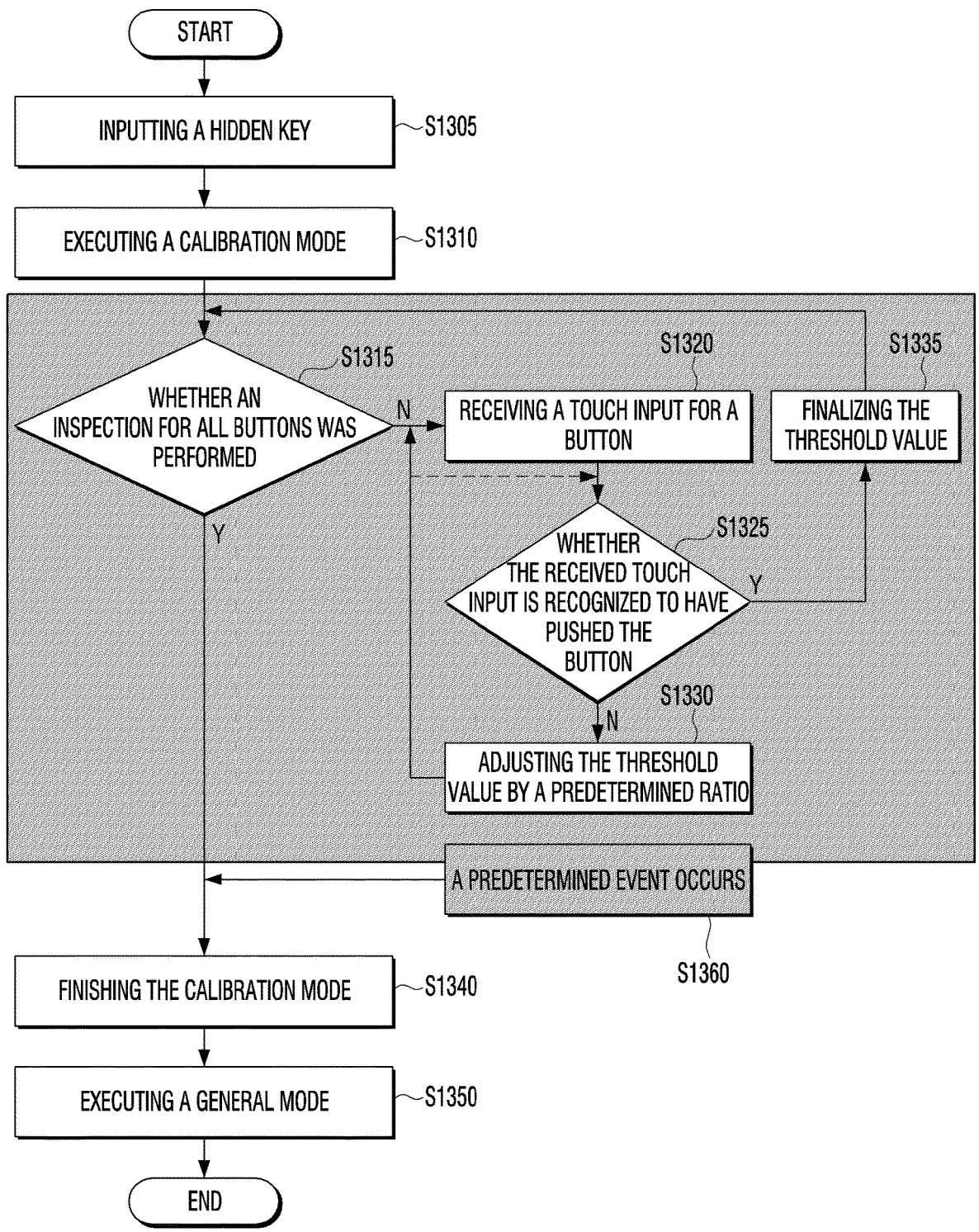
FIG. 13 is a diagram for illustrating a controlling method of a cooking apparatus finishing a calibration mode according to a predetermined event according to an embodiment.

FIG. 13 is a diagram for illustrating a controlling method of a cooking apparatus finishing a calibration mode according to a predetermined event.

Referring to FIG. 13, the operations S1305, S1310, S1315, S1320, S1325, S1330, S1335, S1340, and S1350 may correspond to the operations S1105, S1110, S1115, S1120, S1125, S1130, S1135, S1140, and S1150 described in FIG. 11. Accordingly, overlapping explanation for the operations S1305, S1310, S1315, S1320, S1325, S1330, S1335, S1340, and S1350 will be omitted.

Meanwhile, referring to FIG. 13, if the cooking apparatus 100 identifies that a predetermined event occurred while the cooking apparatus 100 executed the calibration mode, the cooking apparatus 100 may immediately finish the calibration mode at operation S1360.

Here, a predetermined event may include at least one of an event wherein the cooking apparatus 100 does not receive a touch input for a predetermined time period, an event wherein the amount of change of a signal value for a touch input during a predetermined time period falls within a threshold range, an event wherein the cooking apparatus 100 receives an input of a hidden key, an event wherein the cooking apparatus 100 receives an input of a predetermined key other than a hidden key, or an event wherein the cooking apparatus 100 receives a user input identified to have touched a predetermined button for a predetermined time period.

An event wherein the cooking apparatus 100 does not receive a touch input for a predetermined time period may mean a case wherein a user does not touch any button of the cooking apparatus 100 during a predetermined time period. If the cooking apparatus 100 identifies that a user did not touch any button during a predetermined time period, the cooking apparatus 100 may immediately finish the calibration mode.

An event wherein the amount of change of a signal value for a touch input during a predetermined time period falls within a threshold range may mean that there is no meaningful change of a received signal value, and may include an event wherein a touch input is not received during a predetermined time period and an event wherein a user input identified to have touched a predetermined button for a predetermined time period is received.

An event wherein the cooking apparatus 100 receives an input of a hidden key may mean a case wherein an input of the same hidden key as the hidden key input at the operation S1305 is received again. If a hidden key is input again while the calibration mode is executed, the cooking apparatus 100 may finish the calibration mode.

An event wherein the cooking apparatus 100 receives an input of a predetermined key other than a hidden key may mean a case wherein a user sets a predetermined key other than a hidden key for finishing the calibration mode.

An event wherein the cooking apparatus 100 receives a user input identified to have touched a predetermined button for a predetermined time period may mean a case wherein a user sets a separate finishing operation for finishing the calibration mode. For example, in the case of pushing the power/finish button for five seconds or longer, the cooking apparatus 100 may finish the calibration mode.

As illustrated in FIG. 13, by immediately finishing the calibration mode by a predetermined event during the calibration mode, the cooking apparatus 100 may easily execute a general mode. In case the calibration mode is entered by a wrong manipulation of a user, the calibration mode can be easily finished, and thus damage due to a malfunction can be minimized.

Figure 14:
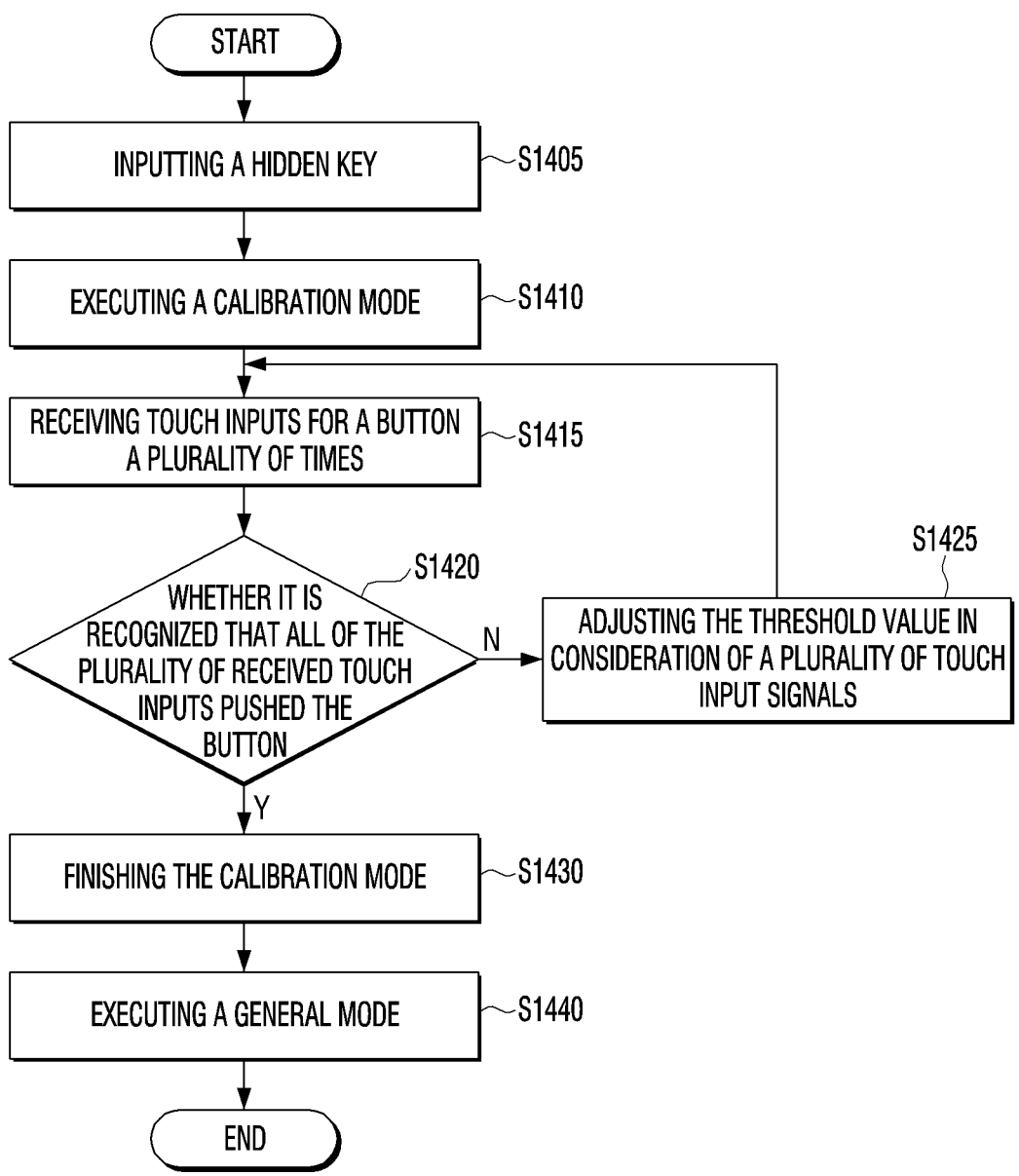
FIG. 14 is a diagram for illustrating a controlling method of a cooking apparatus receiving touch inputs for a specific button a plurality of times for inspection of the specific button according to an embodiment.

FIG. 14 is a diagram for illustrating a controlling method of a cooking apparatus receiving touch inputs for a specific button a plurality of times for inspection of the specific button.

Referring to FIG. 14, the operations S1405, S1410, S1430, and S1440 may correspond to the operations S905, S910, S930, and S940 described in FIG. 9. Accordingly, overlapping explanation for the operations S1405, S1410, S1430, and S1440 will be omitted.

After the calibration mode is executed, the cooking apparatus 100 may perform a touch sensitivity inspection for a plurality of buttons included in the cooking apparatus 100. Then, the cooking apparatus 100 may perform an inspection for each button of the plurality of buttons by a predetermined order. Here, the cooking apparatus 100 may receive user inputs for one button a plurality of times at operation S1415.

As an example, the cooking apparatus 100 may require a plurality of touch inputs to a user for an inspection for a specific button. As a method for requiring a touch input, a notification message instructing to touch a specific button a plurality of times may be displayed on the display, or a notification message may be output as voice data through the speaker. However, according to another embodiment of the disclosure, the cooking apparatus 100 may be implemented as a form of not outputting a separate notification message. A user repairing the cooking apparatus 100 may be an expert, and may have already known that a specific button should be touched as many as a predetermined number of times. Accordingly, the cooking apparatus 100 may be implemented as a form of not outputting a notification message.

The cooking apparatus 100 may receive user inputs for a specific button a plurality of times, and identify whether it is recognized that all of the plurality of received touch inputs pushed (touched) the specific button normally at operation S1420.

Here, in the relation between a plurality of touch inputs and the operation of identifying whether there was a touch S1420, the cooking apparatus 100 may be implemented as two kinds of embodiments. As an example, the cooking apparatus 100 may perform the operation of identifying whether there was a touch S1420 for a specific button only if touch inputs are received by a predetermined number of times. For example, it will be assumed that the predetermined number of times is five times. In case user inputs for the first button (a specific button) were received fewer than five times, the cooking apparatus 100 may not perform the operation of identifying whether there was a touch S1420 for the first button. The cooking apparatus 100 may perform the operation of identifying whether there was a touch S1420 for the first button at the time point when user inputs for the first button were input five times.

As another example, in case user inputs are received a plurality of times during a predetermined time period, the cooking apparatus 100 may perform the operation of identifying whether there was a touch S1420 for a specific button based on the plurality of user inputs input during the predetermined time period. For example, it will be assumed that the predetermined time period is five seconds. In case user inputs for the first button (a specific button) are received four times until a time point when five seconds passed from the time point of input, the cooking apparatus 100 may perform the operation of identifying whether there was a touch S1420 for the first button only in consideration of user inputs corresponding to the four times.

Meanwhile, if the cooking apparatus 100 receives a plurality of user inputs, the cooking apparatus 100 may acquire signal values corresponding to each of the plurality of user inputs for a specific button. Here, the threshold value of the specific button may be one. For example, the threshold value for the first button may be one, but there may be five signal values for the first button (it is assumed that user inputs are received five times).

The cooking apparatus 100 may identify whether each of the plurality of received user inputs touched a specific button. For example, it will be assumed that the threshold value for the first button is 50, and there were five times of user inputs (the first input, the second input, the third input, the fourth input, the fifth input).

As an example, in case all of the signal values corresponding to the first to fifth inputs exceeded the threshold value for the first button 50, the cooking apparatus 100 may determine that the first button is normal. Also, in case the first button was determined to be normal, the cooking apparatus 100 may finish the calibration mode.

The operation S1420 describes an operation of determining whether it is identified that all of a plurality of touch inputs touched a specific button, but the cooking apparatus 100 may determine that the first button is normal even if all touch inputs are not identified to have touched a specific button. As another example, the cooking apparatus 100 may acquire a touch success rate based on a plurality of user inputs, and determine whether a specific button is normal based on whether the acquired touch success rate exceeded a predetermined success rate. The cooking apparatus 100 may determine whether the first button is normal in consideration of a predetermined ratio that signal values corresponding to the first to fifth inputs exceed the threshold value of the first button 50. For example, it will be assumed that a predetermined success rate is 50%. Also, it will be assumed that the signal value corresponding to the first input is 60, the signal value corresponding to the second input is 60, the signal value corresponding to the third value is 60, the signal value corresponding to the fourth value is 30, and the signal value corresponding to the fifth input is 30. In this case, the first to third inputs may be identified to have touched the first button, and the fourth to fifth inputs may be identified to not have touched the first button. Here, the touch success rate may be 60% which is the result of 3/5*100%. The cooking apparatus 100 may determine that the acquired touch success rate 60% exceeded the predetermined success rate 50%, and determine that the first button is normal. Also, in case the first button was determined to be normal, the cooking apparatus 100 may finish the calibration mode.

Meanwhile, in case the cooking apparatus 100 identified that a specific button was not touched based on a plurality of touch inputs, the cooking apparatus 100 may adjust the threshold value in consideration of a plurality of touch input signals at operation S1425.

As an example, the cooking apparatus 100 may set the minimum value among a plurality of signal values corresponding to a plurality of touch inputs as the threshold value of a specific button. In the case of changing the threshold value to the minimum value among a plurality of signal values, the cooking apparatus 100 may receive touch inputs a plurality of times again for an inspection for a specific button at operation S1415.

Meanwhile, for adjusting a threshold value, various mathematical calculation processes such as a median value, an average value, a maximum value, etc. may be applied other than a minimum value. In the case of using the minimum value at the operation S1425, the threshold value of a specific button may set to very low. Here, if the touch sensitivity for a specific button is too sensitive, there is an advantage that touch recognition is performed well, but there is a disadvantage that a user may feel inconvenience for the specific button.

In the case of using the maximum value at the operation S1425, the threshold value of a specific button may set to be very high. Here, if the touch sensitivity for a specific button is too insensitive, there is a disadvantage that touch recognition is not performed well, but there is an advantage that an abnormal button can be easily distinguished.

Accordingly, a user can adjust a threshold value by the most appropriate calculation method in consideration of the characteristics of a product and the needs of consumers. Also, calculation methods may be changed according to user setting.

Figure 15:
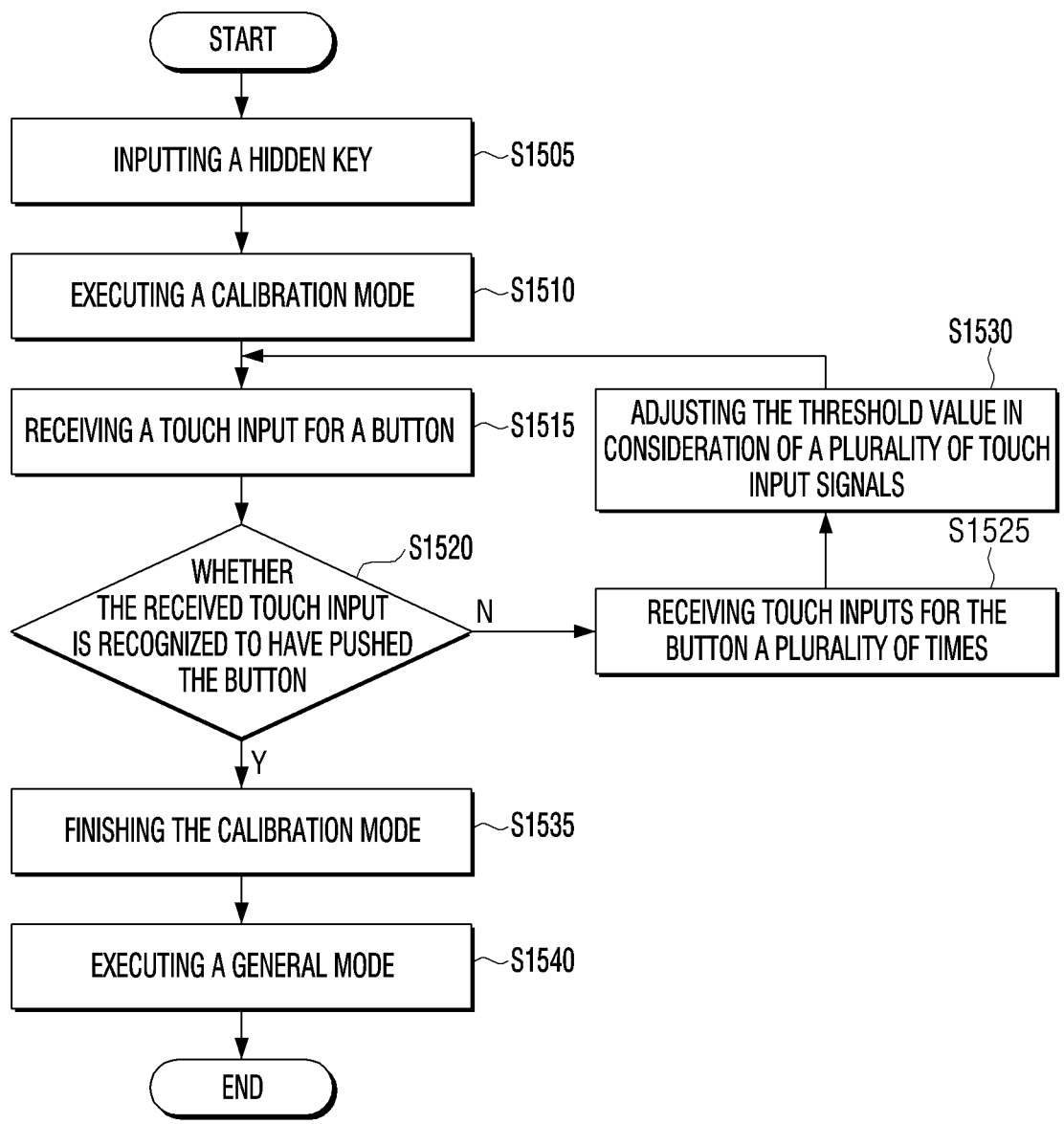
FIG. 15 is a diagram for illustrating a controlling method of a cooking apparatus receiving touch inputs for a specific button a plurality of times limited to a case wherein the specific button was determined to be abnormal according to an embodiment.

FIG. 15 is a diagram for illustrating a controlling method of a cooking apparatus receiving touch inputs for a specific button a plurality of times limited to a case wherein the specific button was determined to be abnormal.

Referring to FIG. 15, the operations S1505, S1510, S1515, S1520, S1535, and S1540 may correspond to the operations S905, S910, S915, S920, S930, and S940 described in FIG. 9. Accordingly, overlapping explanation regarding the operations S1505, S1510, S1515, S1520, S1535, and S1540 will be omitted.

Referring to FIG. 15, if the cooking apparatus 100 identifies that a specific button was touched normally according to a touch input of one time received at the operation S1515, the cooking apparatus 100 may immediately finish the calibration mode. However, if the cooking apparatus 100 identifies that a touch input received at the operation S1515 did not touch a specific button, the cooking apparatus 100 may receive touch inputs for the specific button a plurality of times. Here, for receiving touch inputs for the specific button a plurality of times, the cooking apparatus 100 may perform an operation of displaying a notification message as described in FIG. 14 on the display or outputting the message through the speaker. According to another embodiment of the disclosure, the cooking apparatus 100 may be implemented as a form of not separately providing a notification message.

The operation S1525 may correspond to the operation S1415 in FIG. 14, and the operation S1530 may correspond to the operation S1425 in FIG. 14. Accordingly, overlapping explanation regarding the operations S1525 and S1530 will be omitted.

The difference between the embodiment in FIG. 14 and the embodiment in FIG. 15 may be the difference of a time point when user inputs for an inspection are received a plurality of times. For example, in the embodiment in FIG. 14, user inputs of a plurality times may be received from the start for an inspection of a specific button. Meanwhile, in the embodiment in FIG. 15, a user input of one time may be received first for an inspection of a specific button, and in case the specific button was not touched based on the received user input of one time, the cooking apparatus 100 may receive user inputs a plurality of times.

The embodiment in FIG. 14 may have an advantage that accuracy is high. Also, the embodiment in FIG. 15 may have an advantage that time for an inspection can be shortened. A user may determine the time point of receiving user inputs a plurality of times according to selection or a predetermined method.

Figure 16:
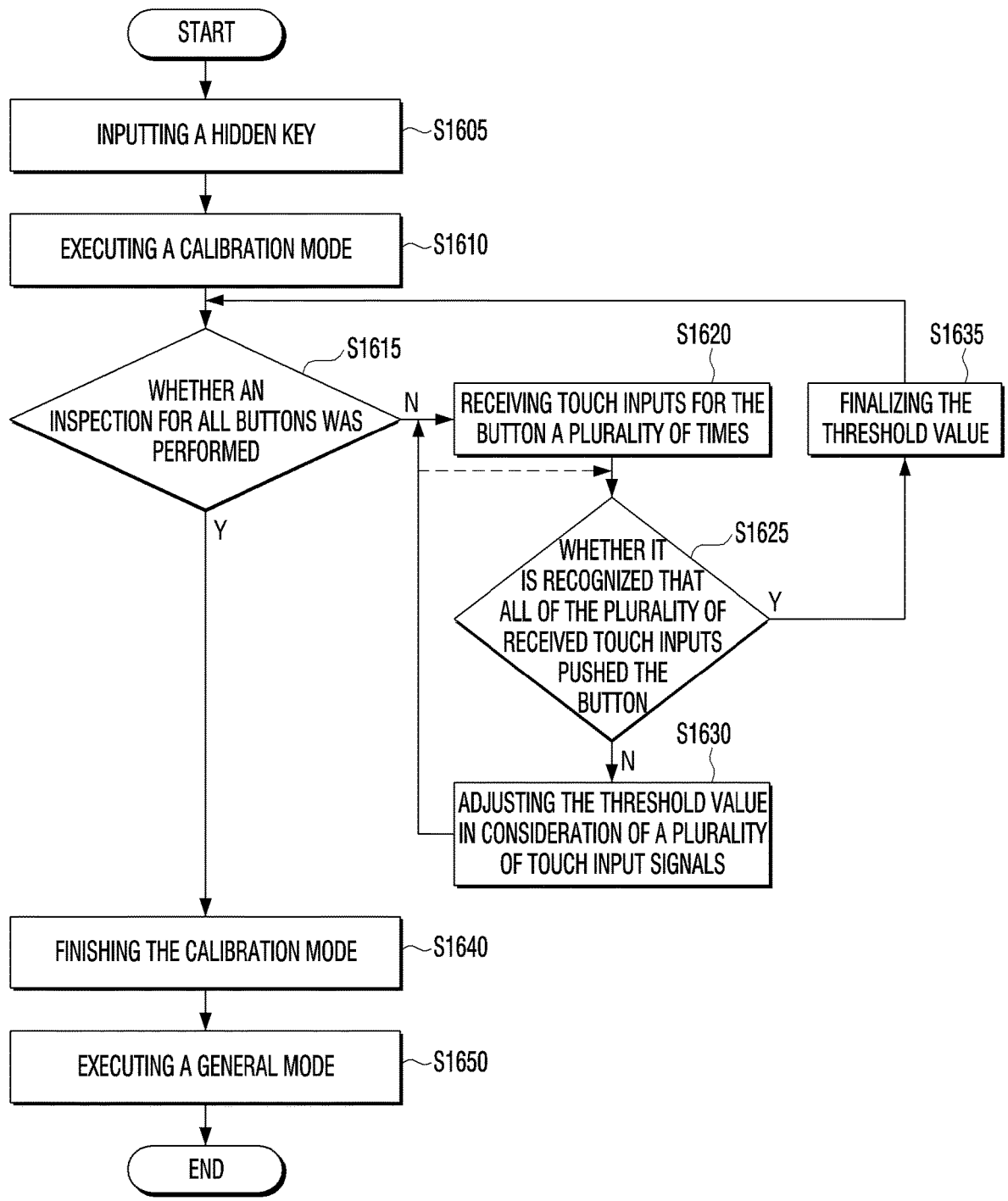
FIG. 16 is a diagram for illustrating a controlling method of a cooking apparatus receiving touch inputs for all buttons a plurality of times for inspection of all buttons according to an embodiment.

FIG. 16 is a diagram for illustrating a controlling method of a cooking apparatus receiving touch inputs for all buttons a plurality of times for inspection of all buttons.

Referring to FIG. 16, the operations S1605, S1610, S1615, S1635, S1640, and S1650 may correspond to the operations S1005, S1010, S1015, S1035, S1040, and S1050 described in FIG. 10. Accordingly, overlapping explanation regarding the operations S1605, S1610, S1615, S1635, S1640, and S1650 will be omitted.

Referring to FIG. 16, if the cooking apparatus 100 identifies that an inspection for all buttons was not performed, the cooking apparatus 100 may receive touch inputs for a specific button a plurality of times at operation S1620. Then, the cooking apparatus 100 may identify whether it is recognized that all of the plurality of received touch inputs touched a specific button normally at operation S1625. Here, the operation S1625 describes an operation of identifying whether all of a plurality of inputs touched a specific button, but the operation may be replaced with an operation of identifying whether some inputs among a plurality of inputs touched a specific button. Detailed explanation in this regard was described above at the operation S1420 in FIG. 14, and the explanation regarding the operation S1420 in FIG. 14 may be applied to the operation S1625. Also, if the cooking apparatus 100 identifies that a specific button is not touched (identifies that a specific button is abnormal) based on a plurality of touch inputs, the cooking apparatus 100 may adjust the threshold value based on a plurality of touch input signals at operation S1630. Here, the operation S1620 may correspond to the operation S1415, and the operation S1625 may correspond to the operation S1420, and the operation S1630 may correspond to the operation S1425.

Meanwhile, according to an embodiment of the disclosure, if the cooking apparatus 100 adjusts the threshold value of a specific button at the operation S1630, the cooking apparatus 100 may receive new inputs for the specific button a plurality of times at the operation S1620. Then, the cooking apparatus 100 may determine whether the specific button is normal based on the adjusted threshold value and the plurality of newly received user inputs, and may repeatedly adjust the threshold value until the specific button becomes normal.

Meanwhile, according to another embodiment of the disclosure, if the cooking apparatus 100 adjusts the threshold value of a specific button at the operation S1630, the cooking apparatus 100 may determine whether the specific button is normal based on the previously received user input and the adjusted threshold value, and may repeatedly adjust the threshold value until the specific button becomes normal.

Then, if the cooking apparatus 100 identifies that the specific button is normal based on the adjusted threshold value, the cooking apparatus 100 may finalize the adjusted threshold value, and store the value in the memory at operation S1635.

Figure 17:
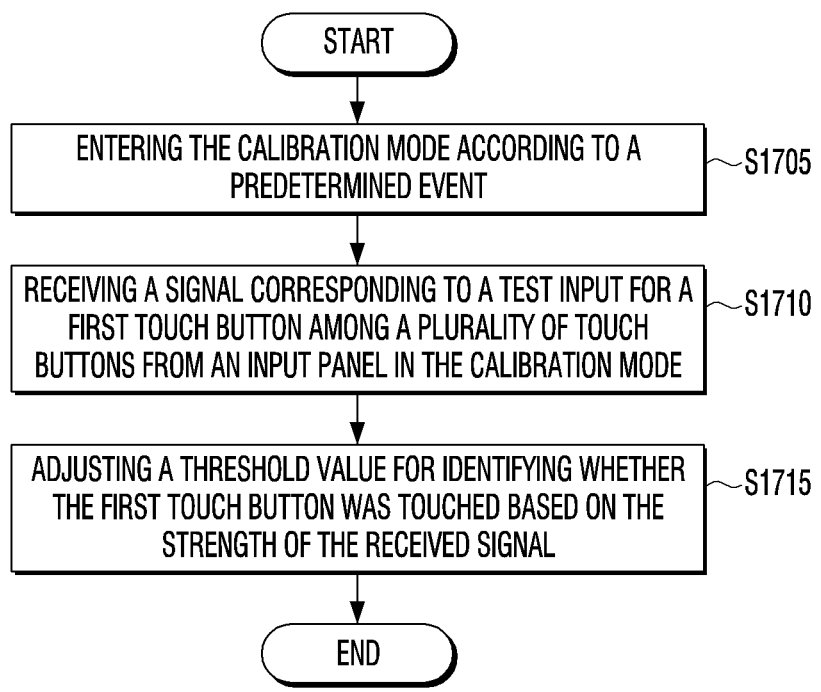
FIG. 17 is a flow chart for illustrating a controlling method according to an embodiment.

FIG. 17 is a flow chart for illustrating a controlling method according to an embodiment of the disclosure.

Meanwhile, in a controlling method of the cooking apparatus 100 including an input panel 110 comprising of a plurality of touch buttons according to an embodiment of the disclosure, the calibration mode may be entered according to a predetermined event at operation S1705. Then, a signal corresponding to a test input for the first touch button among a plurality of touch buttons may be received from the input panel 110 in the calibration mode at operation S1710. Then, a threshold value for identifying whether the first touch button was touched may be adjusted based on the strength of the received signal at operation S1715.

At the operation S1715 of adjusting the threshold value, if the strength of the received signal is smaller than the threshold value, the threshold value may be reduced. Here, the predetermined event may include an event wherein at least some buttons among the plurality of touch buttons are sequentially push-manipulated or an event wherein the at least some buttons are simultaneously push-manipulated.

Meanwhile, the controlling method of the cooking apparatus 100 may further include the steps of identifying whether the strength of a signal received from the input panel 110 after the threshold value was adjusted is greater than or equal to the adjusted threshold value, and based on the strength of the signal received after the threshold value was adjusted being greater than or equal to the adjusted threshold value, finishing calibration for the first touch button.

Here, the controlling method of the cooking apparatus 100 may further include the steps of, after calibration for the first touch button is finished, receiving a signal corresponding to a test input for a second touch button from the input panel 110, and based on the strength of the received signal for the second touch button being smaller than a threshold value for identifying whether the second touch button was touched, adjusting the threshold value for identifying whether the second touch button was touched.

Meanwhile, the controlling method of the cooking apparatus 100 may further include the steps of, based on the strength of the received signal being smaller than a threshold value for identifying whether the first touch button was touched, reducing the threshold value, after the threshold value was reduced, identifying whether the strength of a signal received from the input panel 110 is greater than or equal to the reduced threshold value, and based on the strength of the received signal being smaller than the reduced threshold value, additionally reducing the reduced threshold value.

Here, in the step of reducing the threshold value, if the strength of the received signal is smaller than a threshold value for identifying whether the first touch button was touched, the threshold value is reduced by a predetermined ratio. Also, the controlling method of the cooking apparatus 100 may further include the steps of, after the threshold value was reduced, identifying whether the strength of a signal received from the input panel 110 is greater than or equal to the reduced threshold value, and based on the strength of the received signal being smaller than the reduced threshold value, additionally reducing the reduced threshold value by the predetermined ratio.

Meanwhile, the controlling method of the cooking apparatus 100 may further include the step of, based on the strength of the received signal being smaller than a threshold value for identifying whether the first touch button was touched, setting a value smaller than the strength of the received signal as the threshold value.

Also, the controlling method of the cooking apparatus 100 may further include the steps of receiving a signal corresponding to a touch input for the first touch button from the input panel 110 in a normal mode, and based on the strength of the signal received in the normal mode being greater than or equal to the threshold value, performing an operation corresponding to the first touch button, and based on the strength of the received signal being smaller than the threshold value, not performing an operation corresponding to the first touch button.

Meanwhile, the controlling method of the cooking apparatus 100 as in FIG. 17 may be executed in a cooking apparatus 100 having the configuration illustrated in FIGS. 1 to 3, and may also be executed in a cooking apparatus 100 having a different configuration.

Meanwhile, methods according to the aforementioned various embodiments of the disclosure may be implemented in forms of applications that can be installed on conventional cooking apparatuses 100.

Also, methods according to the aforementioned various embodiments of the disclosure may be implemented only with software upgrade, or hardware upgrade of conventional cooking apparatuses 100.

In addition, the aforementioned various embodiments of the disclosure can be performed through an embedded server provided on the cooking apparatus 100, or an external server of at least one of the cooking apparatus 100 or a display apparatus.

Meanwhile, according to an embodiment of the disclosure, the various embodiments described above may be implemented as software including instructions stored in machine-readable storage media, which can be read by machines (e.g.: computers). Here, the machines refer to apparatuses that call instructions stored in a storage medium, and can operate according to the called instructions, and the apparatuses may include the cooking apparatuses 100 (e.g.: a cooking apparatus A) according to the aforementioned embodiments. In case an instruction is executed by a processor, the processor may perform a function corresponding to the instruction by itself, or by using other components under its control. An instruction may include a code that is generated or executed by a compiler or an interpreter. A storage medium that is readable by machines may be provided in the form of a non-transitory storage medium. Here, the term 'non-transitory' only means that a storage medium does not include signals, and is tangible, but does not indicate whether data is stored in the storage medium semi-permanently or temporarily.

Also, according to an embodiment of the disclosure, methods according to the various embodiments described above may be provided while being included in a computer product. A computer program product refers to a product, and it can be traded between a seller and a buyer. A computer program product can be distributed on-line in the form of a storage medium that is readable by machines (e.g.: a compact disc read only memory (CD-ROM)), or through an application store (e.g.: Play Store™). In the case of on-line distribution, at least a portion of a computer program product may be stored in a storage medium such as the server of the manufacturer, the server of the application store, and the memory of the relay server at least temporarily, or may be generated temporarily.

Further, each of the components according to the aforementioned various embodiments of the disclosure (e.g.: a module or a program) may comprise a singular object or a plurality of objects. Also, among the aforementioned corresponding sub components, some sub components may be omitted, or other sub components may be further included in the various embodiments. Generally or additionally, some components (e.g.: a module or a program) may be integrated as an object, and perform the functions that were performed by each of the components before integration identically or in a similar manner. A module, a program, or operations performed by other components according to the various embodiments may be executed sequentially, in parallel, repetitively, or heuristically. Or, at least some of the operations may be executed in a different order or omitted, or other operations may be added.

While preferred embodiments of the disclosure have been shown and described, the disclosure is not limited to the aforementioned specific embodiments, and it is apparent that various modifications may be made by those having ordinary skill in the technical field to which the disclosure belongs, without departing from the gist of the disclosure as claimed by the appended claims. Also, it is intended that such modifications are not to be interpreted independently from the technical idea or prospect of the disclosure.

What is claimed is:

1. A cooking apparatus comprising:
an input panel including a plurality of touch buttons; and
a processor configured to:
enter a calibration mode according to a predetermined event,
receive a first signal corresponding to a test input for a touch button among the plurality of touch buttons from the input panel in the calibration mode,
based on a first strength of the received first signal being smaller than a threshold value for identifying whether the touch button was touched, reduce the threshold value by a predetermined ratio, identify whether a second strength of a second signal received from the input panel after the threshold value is reduced is greater than or equal to the reduced threshold value, and based on the second strength of the second signal after the threshold value is reduced being smaller than the reduced threshold value, additionally reduce the reduced threshold value by the predetermined ratio.

2. The cooking apparatus of claim 1,
wherein the predetermined event comprises:
an event wherein at least some buttons among the plurality of touch buttons are sequentially push-manipulated or an event wherein the at least some buttons are simultaneously push-manipulated.

3. The cooking apparatus of claim 1,
wherein the processor is configured to:
identify whether the first strength of the first signal received from the input panel after the threshold value is adjusted is greater than or equal to the adjusted threshold value, and based on the first strength of the first signal received after the threshold value is adjusted being greater than or equal to the adjusted threshold value, finish calibration for the touch button.

4. The cooking apparatus of claim 3,
wherein the touch button is a first touch button, and the processor is configured to:
after the calibration for the first touch button is finished, receive a third signal corresponding to a test input for a second touch button among the plurality of touch buttons from the input panel, and
based on a third strength of the third signal for the second touch button being smaller than a threshold value for identifying whether the second touch button was touched, adjust the threshold value corresponding to touch sensitivity of the second touch button.

5. The cooking apparatus of claim 1,
wherein the processor is configured to:
based on the first strength of the first signal being smaller than the threshold value for identifying whether the touch button was touched, set a value smaller than the first strength of the first signal as the reduced threshold value.

6. The cooking apparatus of claim 1,
wherein the processor is configured to:
receive a signal corresponding to a touch input for the touch button from the input panel in a normal mode, and
based on a strength of the signal received in the normal mode being greater than or equal to the threshold value, perform an operation corresponding to the touch button, wherein the operation corresponding to the touch button is not performed when the strength of the received signal is smaller than the threshold value.

7. The cooking apparatus of claim 1,
wherein the processor is configured to:
based on an amount of change of the first strength of the first signal after entering the calibration mode falling within a threshold range for a predetermined time period, finish the calibration mode.

8. The cooking apparatus of claim 1,
wherein the processor is configured to:
based on a plurality of touch inputs for the touch button being sequentially received, receive signals corresponding to the plurality of received touch inputs from the input panel, and
adjust the threshold value based on at least one of a maximum value, a minimum value among the plurality of received signals or an average value of the plurality of signals.

9. The cooking apparatus of claim 1, further comprising:
a display,
wherein the processor is configured to:
control the display to display the threshold value and the first strength of the first signal.

10. The cooking apparatus of claim 1, further comprising:
light emitting diodes corresponding to each of the plurality of touch buttons,
wherein the touch button is a first touch button, and the processor is configured to:
turn on a first light emitting diode corresponding to the touch button in the calibration mode, and
based on calibration for the touch button being finished, turn off the first light emitting diode and turn on a second light emitting diode corresponding to a second touch button among the plurality of touch buttons.

11. The cooking apparatus of claim 1, further comprising:
a heating part,
wherein the input panel is located in an area of an upper plate panel of the cooking apparatus, and
the heating part is located in another area of the upper plate panel.

12. A controlling method of a cooking apparatus including an input panel having a plurality of touch buttons, the method comprising:
entering a calibration mode according to a predetermined event;
receiving a first signal corresponding to a test input for a touch button among the plurality of touch buttons from the input panel in the calibration mode;
based on a first strength of the received first signal being smaller than threshold value for identifying whether the touch button was touched, reducing the threshold value by a predetermined ratio;
identifying whether a second strength of a second signal received from the input panel after the threshold value is reduced is greater than or equal to the reduced threshold value; and
based on the second strength of the second signal after the threshold value is reduced being smaller than the reduced threshold value, additionally reducing the reduced threshold value by the predetermined ratio.

13. The controlling method of a cooking apparatus of claim 12,
wherein the predetermined event comprises:
an event wherein at least some buttons among the plurality of touch buttons are sequentially push-manipulated or an event wherein the at least some buttons are simultaneously push-manipulated.

14. The controlling method of a cooking apparatus of claim 12, further comprising:
identifying whether the first strength of the first signal received from the input panel after the threshold value is adjusted is greater than or equal to the adjusted threshold value; and based on the first strength of the first signal received after the threshold value is adjusted being greater than or equal to the adjusted threshold value, finishing calibration for the touch button.

15. The controlling method of a cooking apparatus of claim 14, wherein the touch button is a first touch button, and the method further comprises:

after the calibration for the first touch button is finished, receiving a third signal corresponding to a test input for a second touch button among the plurality of touch buttons from the input panel; and based on a third strength of the third signal for the second touch button being smaller than a threshold value for identifying whether the second touch button was touched, adjusting the threshold value corresponding to touch sensitivity of the second touch button.

\* \* \* \* \*